United States Patent
Razavi et al.

(10) Patent No.: US 7,336,114 B2
(45) Date of Patent: Feb. 26, 2008

(54) HIGH-SPEED LATCHING TECHNIQUE AND APPLICATION TO FREQUENCY DIVIDERS

(75) Inventors: Behzad Razavi, Los Angeles, CA (US); Zaw Min Soe, Encinitas, CA (US)

(73) Assignee: Wionics Research, Irvine, CA (US)

( * ) Notice: Subject to any disclaimer, the term of this patent is extended or adjusted under 35 U.S.C. 154(b) by 50 days.

(21) Appl. No.: 11/398,278

(22) Filed: Apr. 5, 2006

(65) Prior Publication Data
US 2007/0236267 A1    Oct. 11, 2007

(51) Int. Cl.
*H03K 3/00* (2006.01)
(52) U.S. Cl. .................................... 327/199; 327/215
(58) Field of Classification Search ............... None
See application file for complete search history.

(56) References Cited
U.S. PATENT DOCUMENTS

| | | | | |
|---|---|---|---|---|
| 4,961,007 A * | 10/1990 | Kumanoya et al. | ......... | 327/537 |
| 5,017,800 A * | 5/1991 | Divan | ......... | 307/66 |
| 5,877,642 A * | 3/1999 | Takahashi | ......... | 327/207 |
| 6,252,434 B1 * | 6/2001 | Nag et al. | ......... | 327/65 |
| 6,509,722 B2 * | 1/2003 | Lopata | ......... | 323/280 |
| 6,842,054 B2 | 1/2005 | Wang | | |
| 7,148,741 B2 * | 12/2006 | Berger et al. | ......... | 327/538 |
| 7,158,361 B2 * | 1/2007 | Horn | ......... | 361/154 |
| 2005/0258883 A1 * | 11/2005 | Farjad-rad et al. | ......... | 327/295 |

OTHER PUBLICATIONS

CMOS Frequency Dividers: http://larc.ee.nthu.edu.tw/~jcobr/VLSI94/VLSI_lecture49_C5c.pdf 2-3 divder, 1994.
Behzad Razavi, RF Microelectronics, Prentice Hall, Upper Saddle River NJ, ISBN 0-13-887571-5, pp. 270-271, 1998.

* cited by examiner

Primary Examiner—Cassandra Cox
(74) Attorney, Agent, or Firm—Thaddeus Gabara

(57) ABSTRACT

The inventive technique can dynamically adjust the current being applied within the components of a prescaler or divider. This dynamic scaling of the current can improve the speed of the divider by a factor of two or reduce the average current in half when compared to the conventional prescaler. Inverters are used to directly adjust the dynamic value of the currents. The removal of the conventional NMOS device within the conventional circuit eliminates one gate delay in the CML prescaler. Second, the inventive prescaler circuits operate under a current injection/extraction technique. A group of small matched inverters can be used to drive each current switching circuit independently within the entire prescaler as compared to a large buffer driving the entire conventional prescaler. Finally, dynamic current scaling offers the designer additional flexibility in the design trade off between the maximum current applied to the load and achieving the maximum performance.

31 Claims, 20 Drawing Sheets

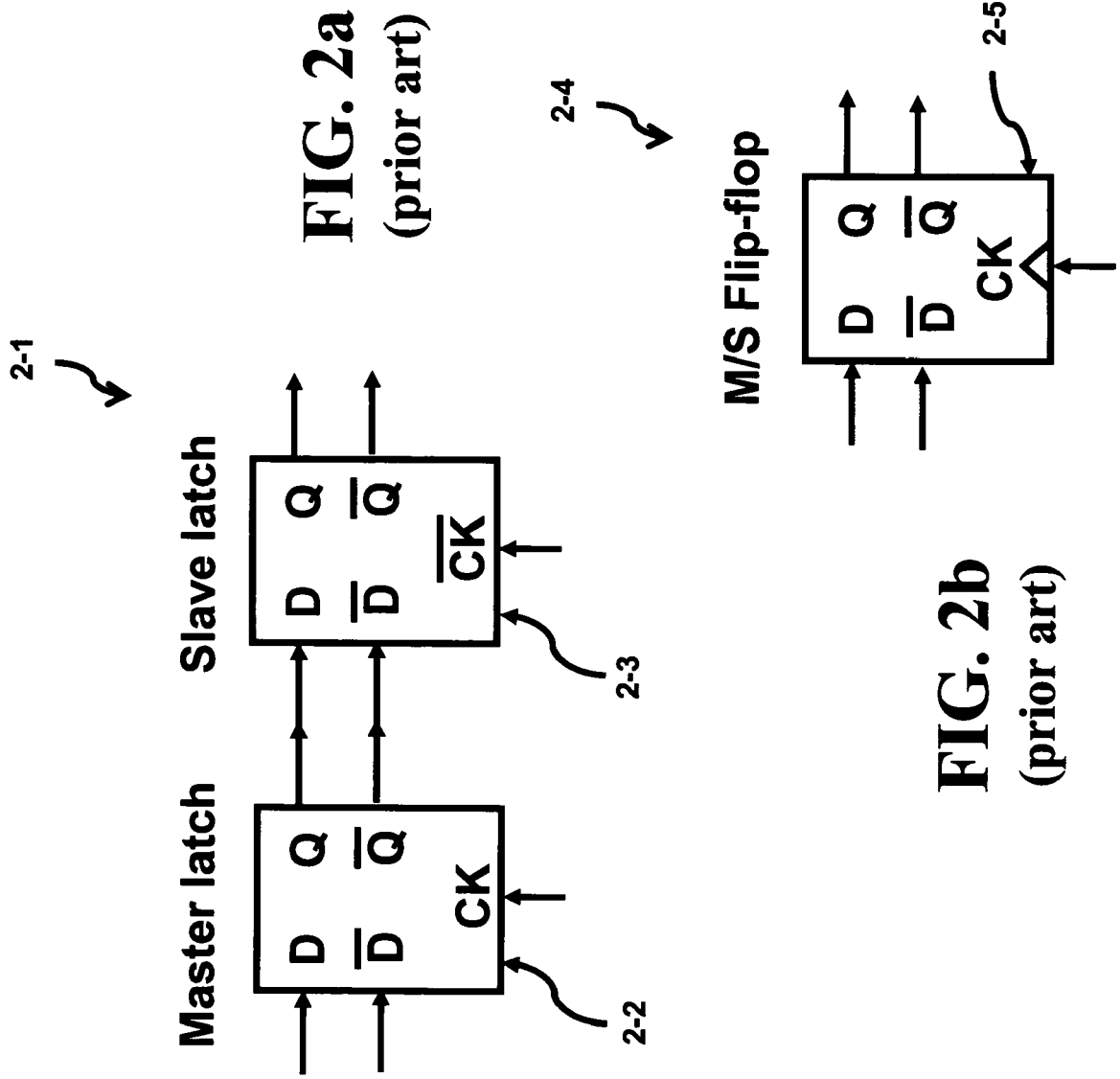

HIGH-SPEED LATCHING TECHNIQUE AND APPLICATION TO FREQUENCY DIVIDERS

BACKGROUND OF THE INVENTION

One of the critical building blocks of wireless system is the frequency synthesizer or PLL (Phase Lock Loop). The synthesizer generates the required LO (Local Oscillator) signals to perform the frequency translations. Depending on the frequency planning of the wireless system, the frequency of the LO can be comparable with RF frequencies. In UWB systems, for example, the required frequency of the LO can be as high as 6 GHz. This prescaler takes the high frequency output of a LO and divides the applied frequency to a lower value. The prescaler circuit becomes the weak link of the entire system if the prescaler fails to properly divide the applied frequency.

To understand the important aspect of the divider, let's us consider an RF IC manufacturing yield. Over the process variations of the manufacturing yield, the receiver gain, NF (Noise Figure), output transmitter power and linearity can vary considerably. Under these conditions, as long as the synthesizer is still in lock, the end user can still establish a communication link. However, the system may suffer a degradation in performance. Thus, the system can operate and function, although the system may operate poorly.

If the synthesizer performance degrades and does not lock at all over the entire process, then, the yield loss can be complete and total. There will be no parts available. Therefore, the goal of the typical system designer is to make sure the synthesizer does not become a limiting factor in the operation of the system. The critical part of the synthesizer that can limit the bandwidth over the process is the prescaler or divider. This is the circuit component that must operate at the highest frequency within the integrated circuit other than the circuit that generates the high frequency LO.

A typical synthesizer consists of a phase detector, a charge pump, a loop filter, a VCO (Voltage Controlled Oscillator), a prescaler, and programmable dividers. Since the phase detector, charge pump, loop filter, and programmable dividers occur after the prescaler or divider, these components always operated at lower frequencies. Thus, the prescaler or divider is the most critical block and needs to be as robust as possible to insure that it operates at high frequencies.

A typical design of a conventional prescaler consists of high-speed latches and flip flops designed using CML (Current Mode Logic) techniques. The designer will determine the required speed over worst case. Under these conditions, the designer will set the current within the circuit. The maximum output swing is determined by resistance (if a resistor load is used) and the bias current. In a well-designed circuit, the time constant at the falling edge is determined by the bias current and output capacitance of the CML logic. For the rising edge, the RC time constant (determined by the resistive load and output capacitance) should be fast enough to charge up the capacitance of the following stage. This eliminates the performance degradation due to device transconductance since the RC time constant determines the rise time. Dependent on the technology, the capacitance load can be made a design variable but typically remains somewhat fixed. This occurs because the device must be large enough to provide the gain at the operating frequency, but not so large that its capacitance slows the circuit down.

Thus, a need exists to allow for greater flexibility in the design of the prescaler to allow the prescaler to operate more realiably at higher frequencies. In addition, as pointed out above, the capacitive load and device size of the conventional design of the prescaler limits the design flexibility. The inventive technique described in this specification overcomes these and other shortcoming of the current conventional prescaler design.

BRIEF SUMMARY OF THE INVENTION

The prescaler is a frequency divider that contains CML logic components which includes a first and second differential amplifier and/or cross-coupled latch. The inventive technique can dynamically adjust under a designer's control the current being applied to the prescaler. The high frequency clock signal of the LO generates one of two logic states; a sensing state and a holding state. When the clock signal that is applied to the prescaler is in the sensing state, the current in the first differential amplifier is set to a maximum. This increases the bandwidth of the first differential amplifier and sets it to a high level. The signal is sensed or captured within the first differential amplifier.

When the clock signal that is applied to the prescaler is in the holding state, the signal within the first differential amplifier is applied to the first cross-coupled latch which holds the signal within the first latch. During this interval, the current in the first differential amplifier is reduced to minimum and the current to the first cross-coupled latch is set to a maximum. Similarly, the second amplifier and the second latch are operated in a similar way to insure that the two latches perform as a master/slave flip flop. This dynamic scaling of the current within both loads (differential amplifier and cross-coupled latch) improves the speed of the divider by a factor of two when compared to a conventional fixed bias current. Or the overall average current within the prescaler can be reduced by a factor of two when compared to a conventional fixed bias current.

In order to perform dynamic scaling of the current, the VCO outputs are buffered by a set of inverters. These same inverters are used to directly adjust the dynamic value of the currents. The removal of the conventional NMOS device within the conventional circuit eliminates one gate delay in the CML prescaler. Second, the inventive prescaler circuits operate under a current injection/extraction technique. A group of small matched inverters can be used to drive each current switching circuit (amplifier or cross-couple latch) independently within the entire prescaler as compared to a large buffer driving the entire conventional prescaler. In addition, the delay of the small matched inverters can be considered to be negligible because from a performance perspective, these inverters extend the reach of the VCO. Thus, the delay of these inverters does not impact the performance of the circuit. Finally, dynamic current scaling offers the designer additional flexibility in the design trade off between the maximum current applied to the load and achieving the maximum performance.

BRIEF DESCRIPTION OF THE SEVERAL VIEWS OF THE DRAWINGS

FIG. 2a illustrates a block diagram of a master and slave latch.

FIG. 2b illustrates the symbol for a M/S flip flop.

FIG. 6b depicts the circuit components contained within the block diagram of FIG. 6a.

DETAILED DESCRIPTION OF THE INVENTION

Figure 1A:
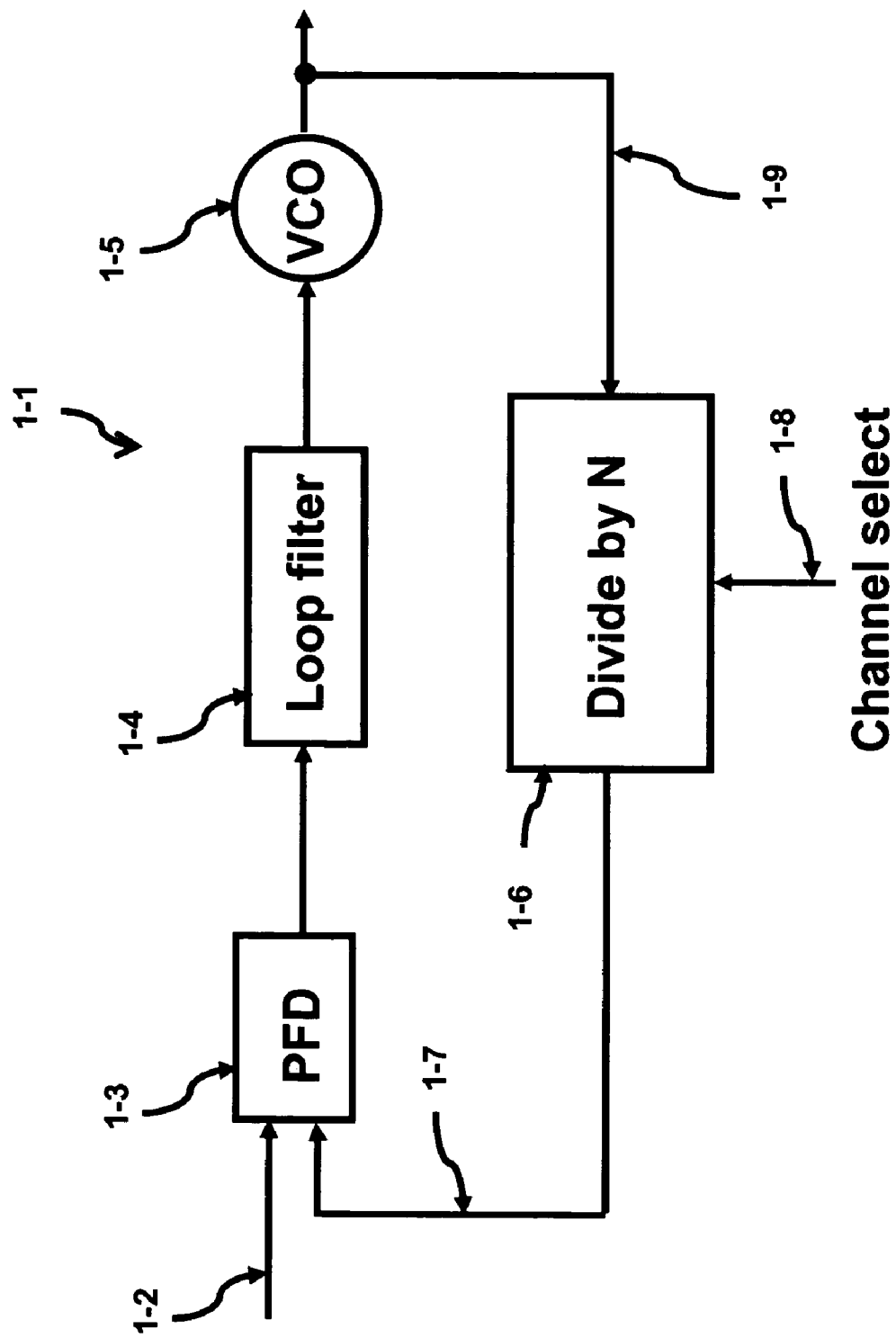
FIG. 1a depicts a PLL (Phase Lock Loop) using a Divide by N block.

A PLL 1-1 is illustrated in FIG. 1a. The reference clock signal is applied at node 1-2. The Phase and Frequency Detector (PFD) compares this signal with the output 1-7 of the divide by N 1-6. The loop filter 1-4 filters the signal and applies it to the Voltage Controlled Oscillator (VCO) 1-5. The output 1-9 of the VCO is applied to block 1-6 and is divided either by N or N+1, where the channel select control 1-8 determines whether the divide by N 1-6 divides by N or N+1. The critical frequency component in the circuit is the divide by N 1-6 and techniques are required to improve the frequency of operation of this block.

Figure 1B:
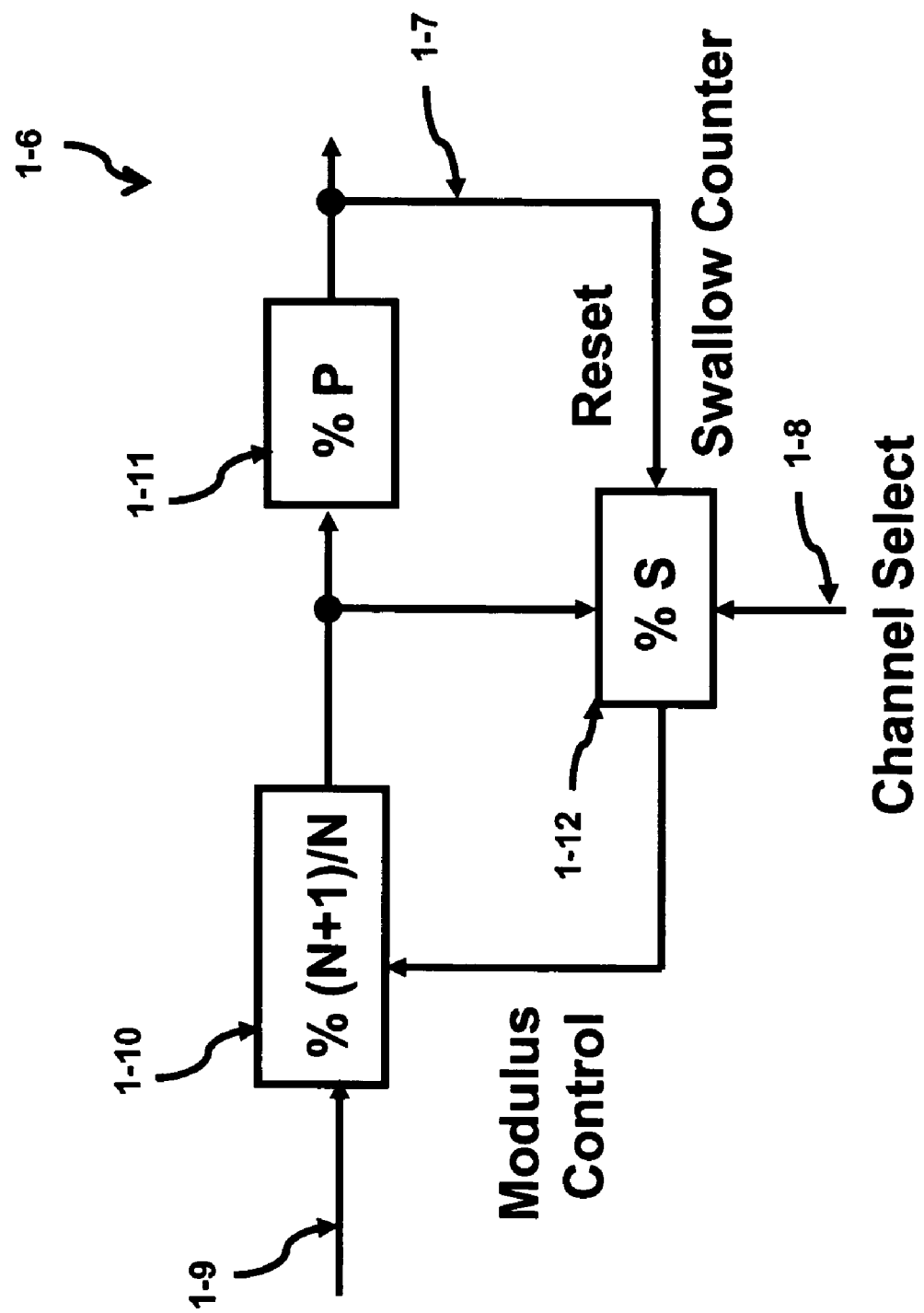
FIG. 1b shows the contents of the Divide by N block in greater detail.

FIG. 1b illustrates the details of the Divide by N block 1-6. It is a "pulse-swallow divider" circuit. The prescaler 1-10 takes the VCO output and applies the resultant signal to the program counter 1-11 and the pulse-swallow divider 1-12. The prescaler 1-10 divides the input by either N+1 or N depending on the modulus control signal. The program counter 1-11 always divides by P and the swallow counter 1-12 divides by S where S can vary from 1 to the maximum number of channels depend on the value of the channel select signal 1-8.

FIG. 2a illustrates a master/slave block diagram 2-1. The master latch 2-2 is coupled to the slave latch 2-3. The inputs to this block diagram are D and D bar (where "D bar" implies the inversion of D) and the outputs are Q and Q bar. In FIG. 2b, a single symbol 2-4 of a M/S flip flop 2-5 is indicated.

Figures 3A, 3B:
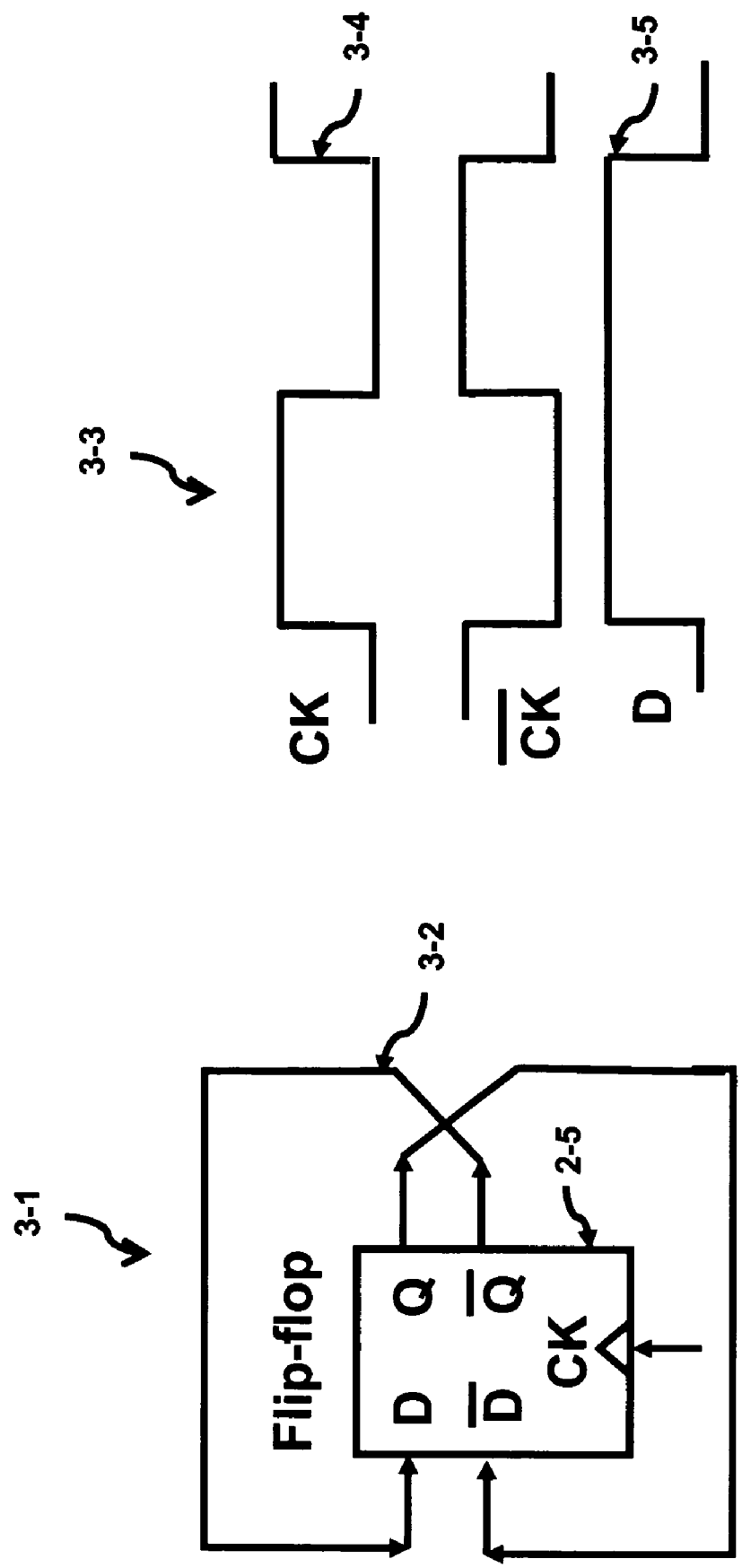
FIG. 3a shows a M/S flip flop configured as a divider.
FIG. 3b depicts the timing waveforms of the M/S flip flop divider.

FIG. 3a illustrates a divide by 2 block diagram 3-1 using the M/S flip flop 2-5. Note that both feedback path of the FF (Flip Flop) contains an inversion. That is, the Q output is applied to the D bar input. Also note that this FF 2-5 uses balanced inputs and balanced outputs where balanced implies the generation of a signal and its signal bar. The timing diagram 3-3 of the FF is shown in FIG. 3b. The applied clock signal is indicated in 3-4 and the data lead generates the signal 3-5 which is operating at half the frequency of the clock signal. The CK and CK bar signals typically have a sinusoidal waveshape but are shown in FIG. 3b as clean digital signals to simplify the diagram.

Figure 4:
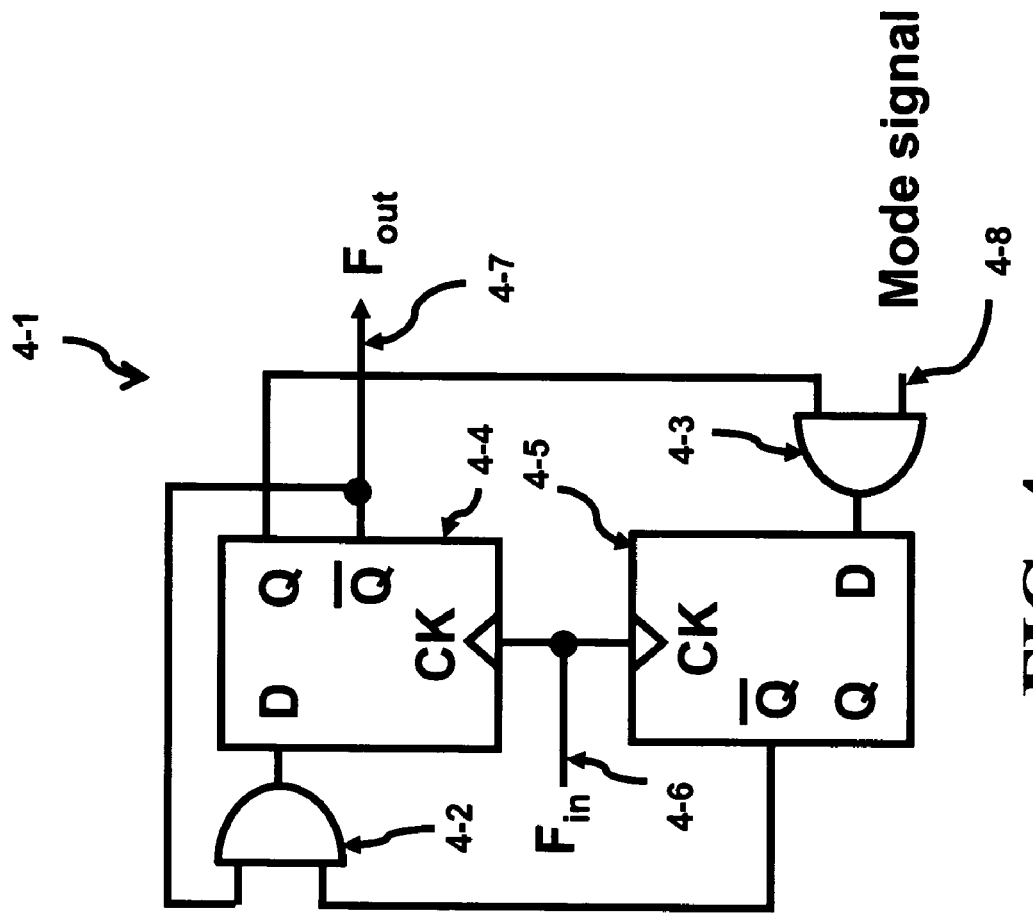
FIG. 4 illustrates a 2/3 dual-modulus prescaler.

A dual-modulus prescaler 4-1 is shown in FIG. 4. It consists of two FF's 4-4 and 4-5 clocked by a common clock signal $F_{in}$ 4-6. The D input of both FF's contain an AND gate 4-2 and 4-3. A mode signal 4-8 is applied to one of the inputs of the AND gate 4-3. The output of the prescaler 4-1 is $F_{out}$ 4-7. When the mode signal 4-8 is low, the top FF is configured to divide by two. When the mode signal is high, both FF are series connected and divide by three. Other variations of the prescaler are possible; for instance 8/9, 16/17, etc. In addition, several of the 2/3 prescalers can be connected in series to achieve a wider range of divider values. As mentioned earlier, the prescaler 4-1 is a critical component to achieve high frequency operation in a synthesizer. Any improvement in the operation of this circuit block 4-1 with regards to achieving a higher frequency of operation helps to create a more robust system.

Figure 5B:
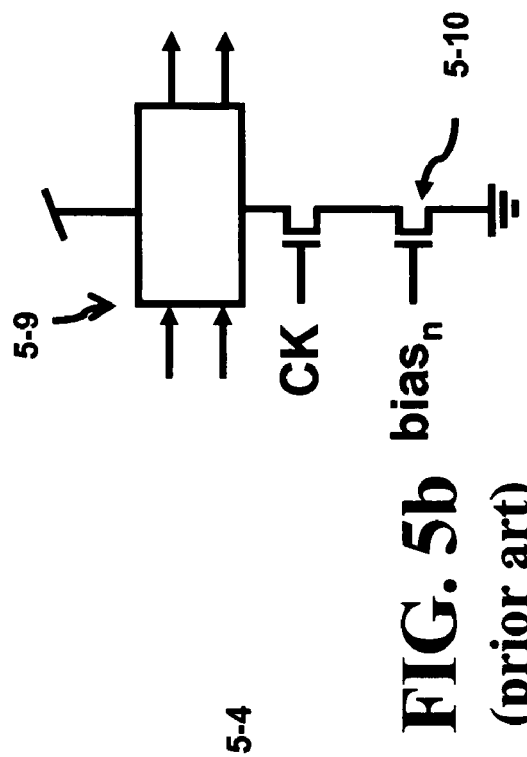
FIG. 5b illustrates the current branch after the current regulator is replaced by a NMOS current source.
Figure 5D:
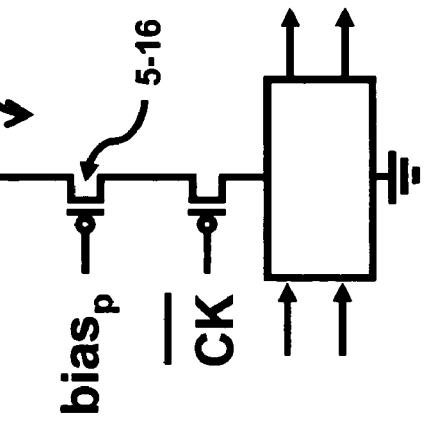
FIG. 5d illustrates the current branch after the current regulator is replaced by a PMOS current source.
Figure 5A:
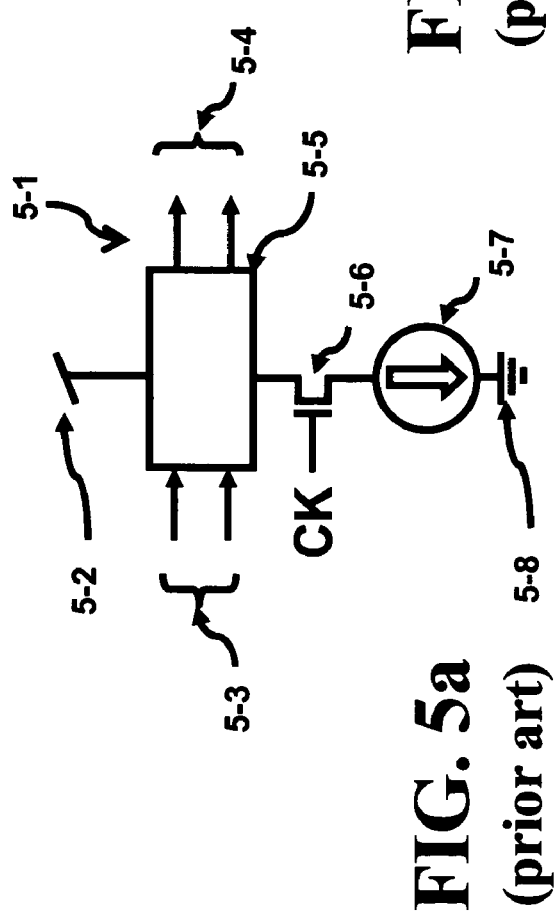
FIG. 5a shows a current branch containing an upper load, a current regulator and a series MOS switch.
Figure 5C:
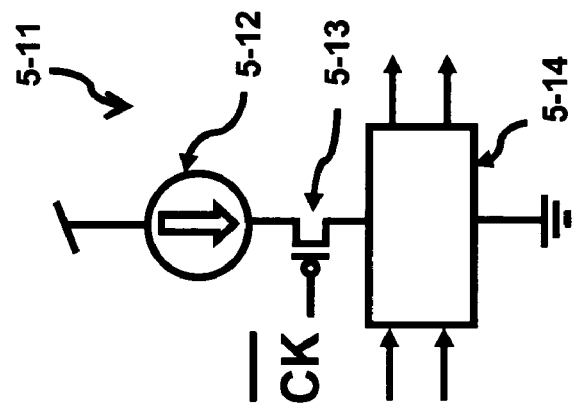
FIG. 5c shows a current branch containing a lower load, a current regulator and a series MOS switch.

FIG. 5a illustrates a current stack 5-1 containing a series connection of a load 5-5, a clock switch 5-6, and current regulator 5-7. The current stack is powered by the nodes 5-2 and 5-8. The inputs to the load 5-5 are depicted as 5-3 while the outputs are 5-4. The clock signal that is applied to the gate of device 5-6 can be either a CK or a CK not signal depending on the desired operation of the circuit. FIG. 5b depicts the circuit 5-9 where the regulator 5-7 symbol is replaced by a current sink NMOS device 5-10 controlled by the a signal $bias_n$. FIG. 5c depicts a second current stack 5-11 where the load 5-14 is on the bottom. There is a current regulator 5-12, and a clock switch 5-13. FIG. 5d shows the circuit 5-15 where replaces the regulator is replaced with a current source PMOS device 5-16.

Figure 6B:
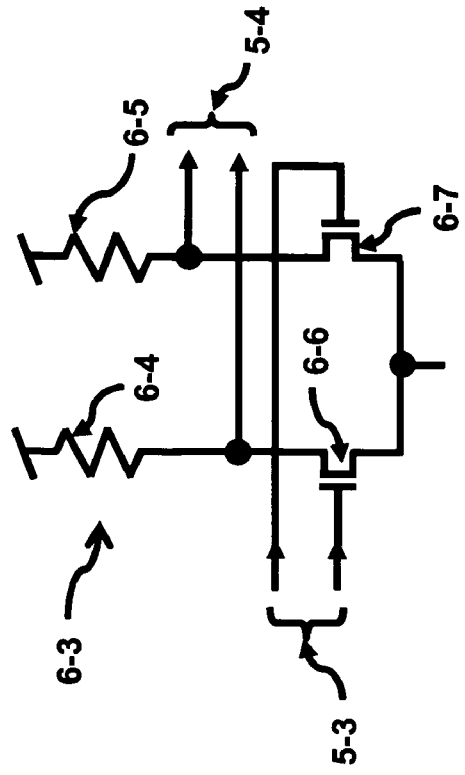
Figure 6D:
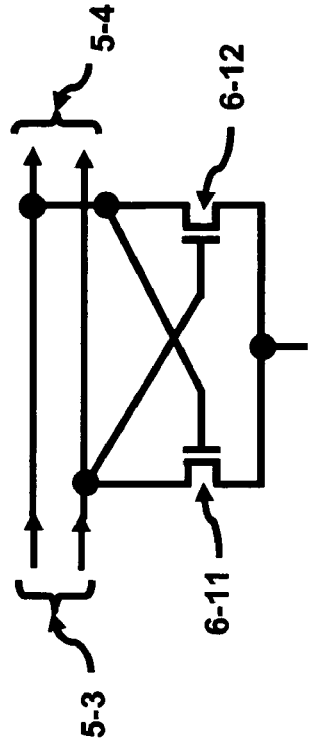
FIG. 6d shows the circuit components contained within the block diagram of FIG. 6c.
Figure 6A:
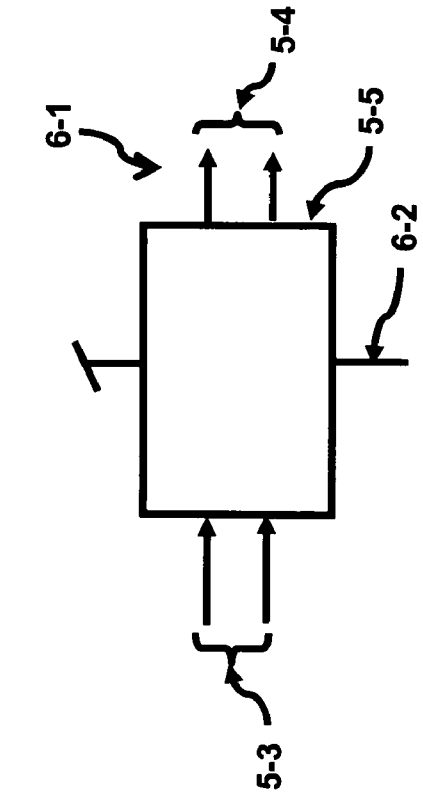
FIG. 6a shows a block diagram of a differential amplifier.

FIG. 6a depicts a block diagram 6-1 of a differential amplifier load 5-5. The load has inputs 5-3 and a set of outputs 5-4. The node 6-2 connects to the current stack mentioned previously. FIG. 6b illustrates one version of a differential amplifier circuit 6-3 using a differential pair of MOS devices 6-6 and 6-7 and having an internal load formed using resistive loads 6-4 and 6-5. The entire circuit 6-3 is called a load for the current stack. Inside the load there are two resistive loads 6-4 and 6-5. These resistive loads 6-4 and 6-5 are not to be confused with the load 5-5 since the circuit 6-3 loads the current stack while the resistive loads provide a load for each MOS device. Also note that the MOS devices can be replaced with BJT's or any comparable active device.

Figure 6C:
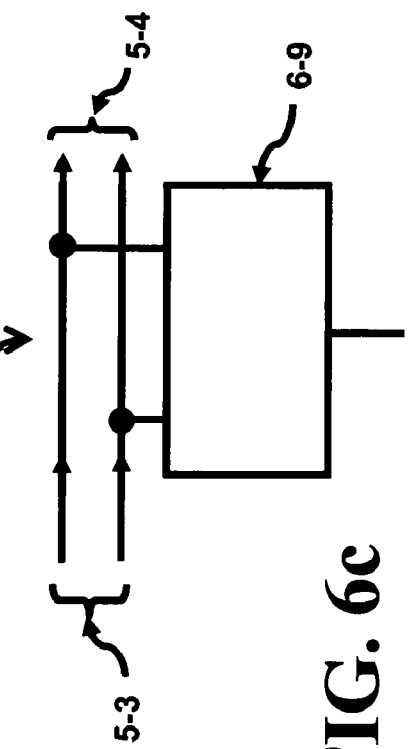
FIG. 6c shows a block diagram of a cross-coupled latch.

FIG. 6c shows the block diagram 6-8 for a cross-coupled latch load 6-9. Note that the inputs 5-3 and outputs 5-4 are shorted together. Thus the terminology of inputs and outputs for a cross-coupled latch are interchangeable. A circuit diagram 6-10 of the cross-coupled latch is illustrated in FIG. 6d. The cross coupled structure consists of two MOS devices 6-11 and 6-12 which are cross coupled to each other. This structure gives the latch its memory capability to hold and retain a data value.

Figure 7:
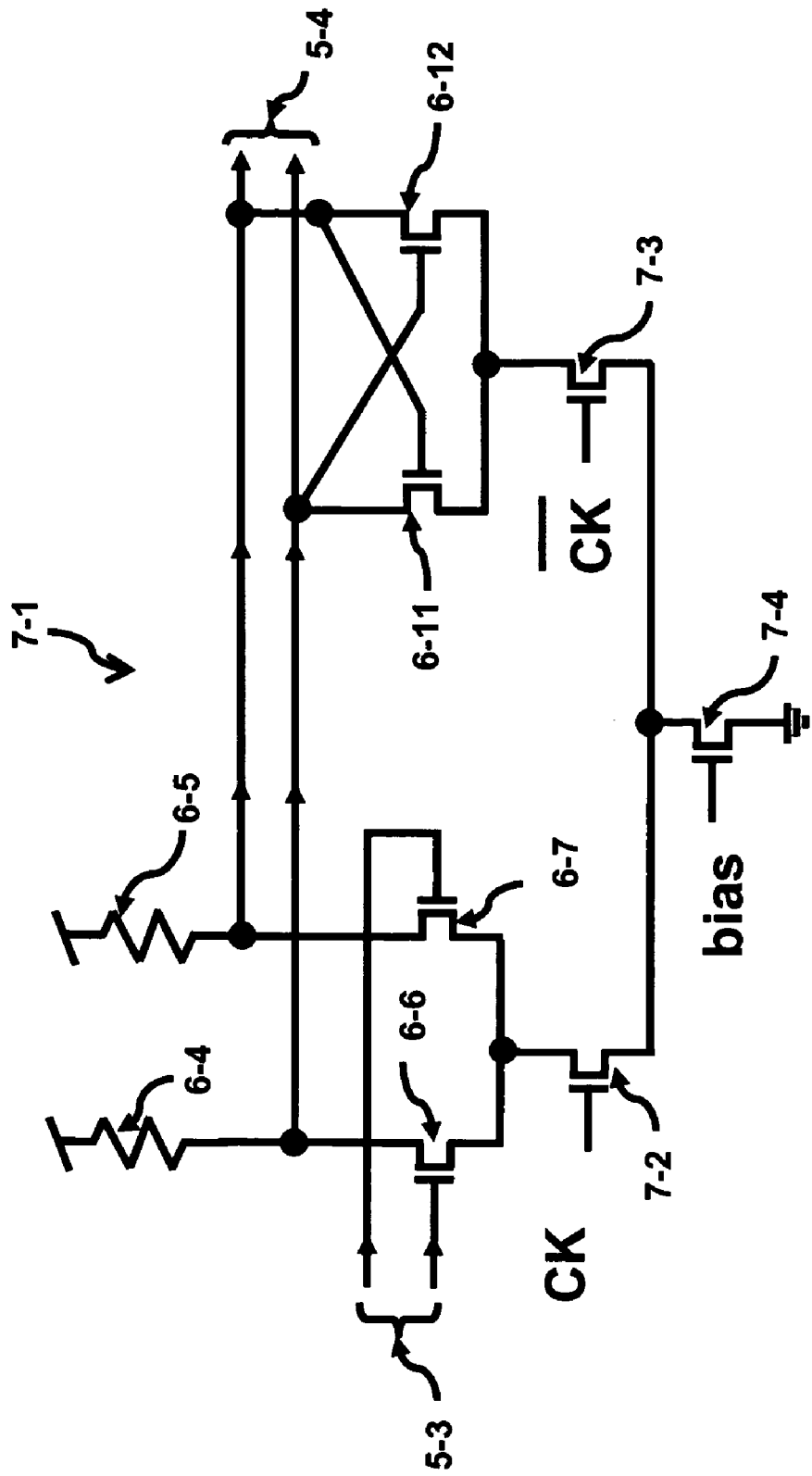
FIG. 7 depicts a prior art latch circuit.

A conventional CML (Current Mode Logic) latch circuit 7-1 is depicted in FIG. 7. It consists of a differential load circuit coupled to a cross-coupled latch. In addition, each circuit is coupled to a MOS switch 7-2 and 7-3 controlled by a clock CK and an inverse clock CK not signal. Finally, the device 7-4 controlled by the bias signal controls the current flow. Because of the various components are connected in series between the source of potential, each component drops a portion of the applied voltage. Thus, the voltage swing at the output nodes 5-4 only swings through a range of a few hundred millivolts. Secondly, because the overall circuit maintains a constant current controlled by device 7-4, current steering is used to generate the voltage swing. Thirdly, the circuit must be able to extract this small voltage swing after being applied to the inputs 5-3. This type of logic is called CML logic and offers the ability to perform at high frequencies. However, as will be shown shortly, this circuit can be improved to achieve higher frequencies of operation using the invention technique.

Figure 8:
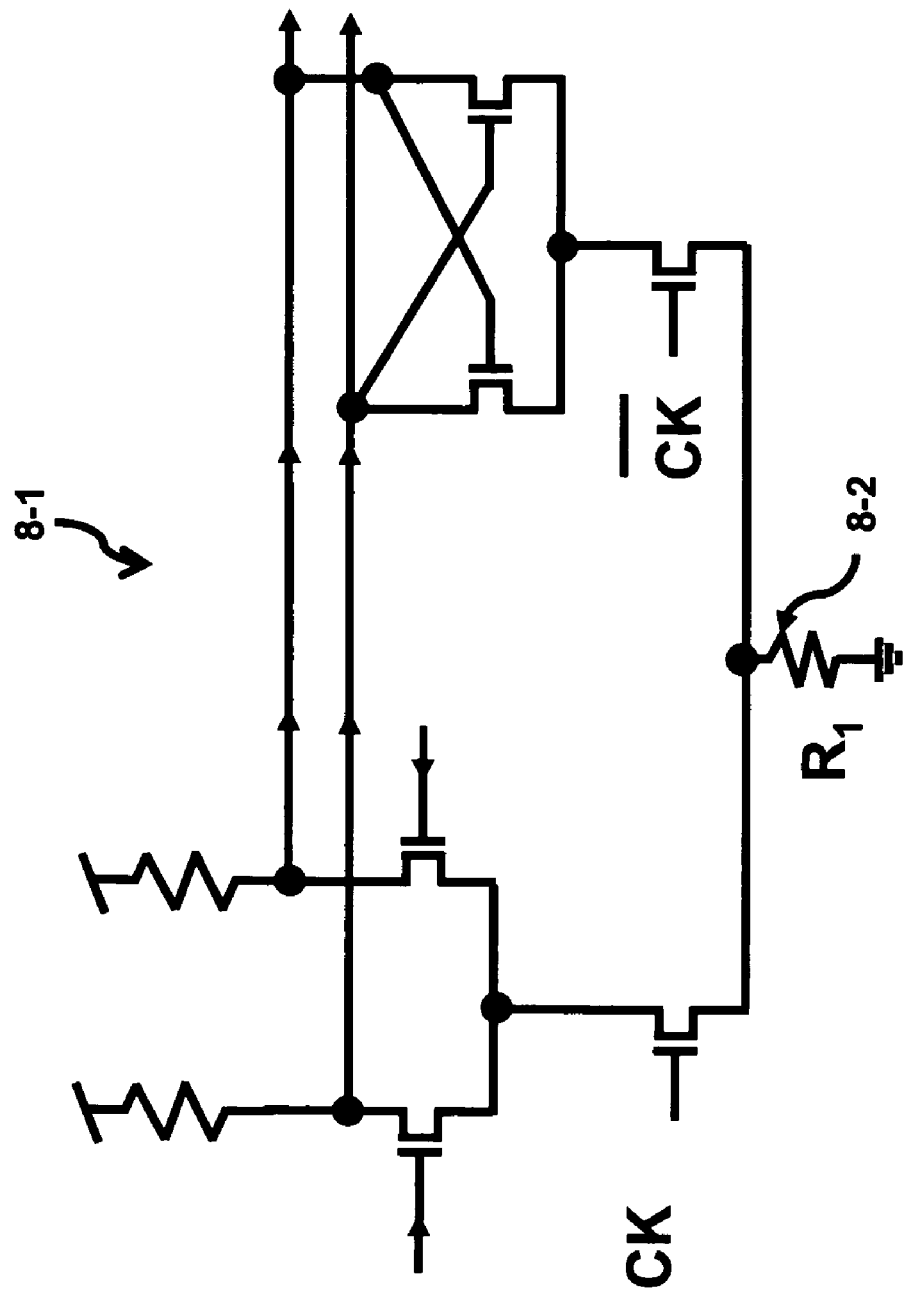
FIG. 8 illustrates a second version of a prior art latch circuit.

FIG. 8 shows a second version 8-1 of a CML circuit where the bias 7-4 of FIG. 7 is replaced by a resistor 8-2. Otherwise, the circuit performs as before and eliminates the need to generate the bias signal control.

Figure 9:
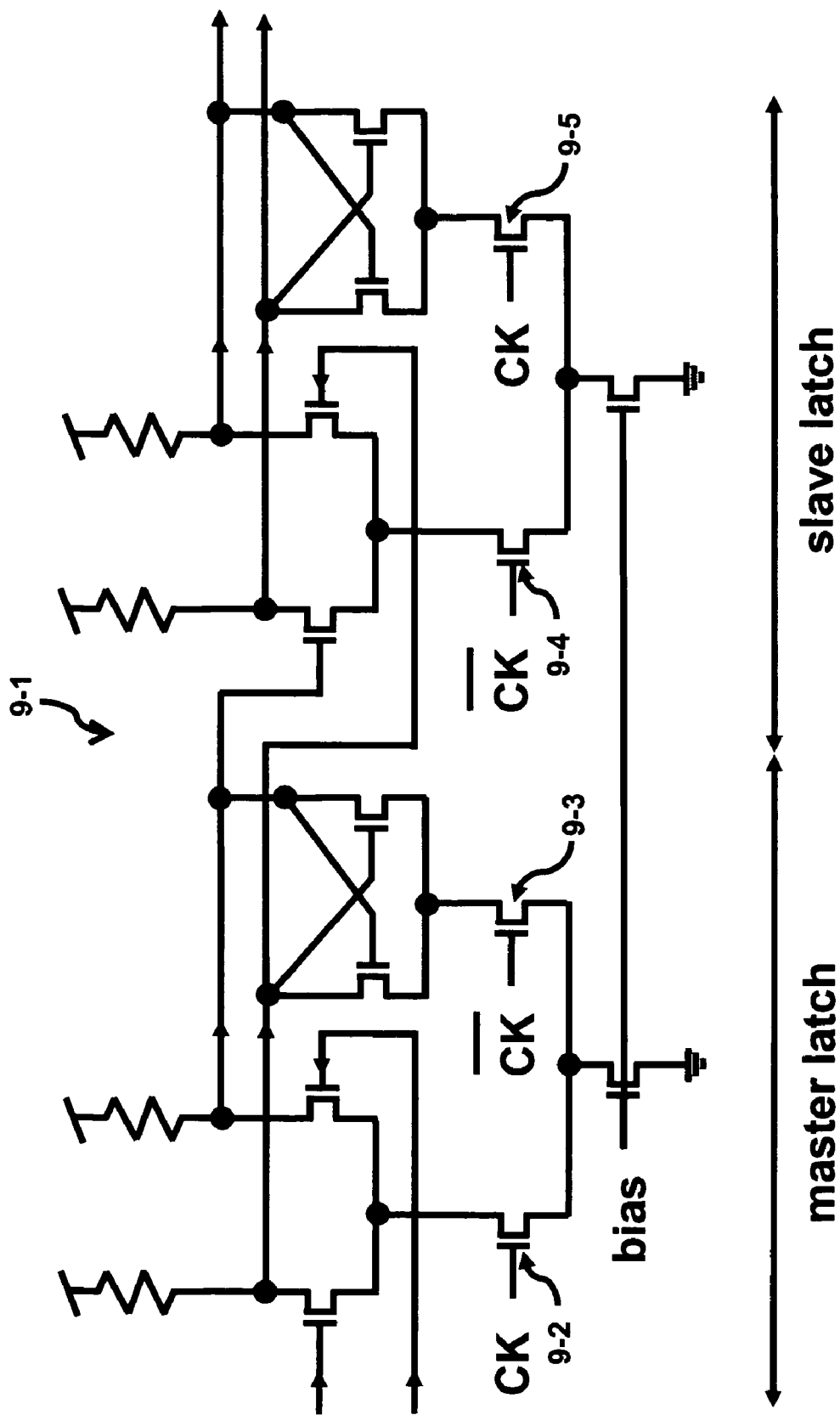
FIG. 9 depicts a prior art master/slave flip flop.

FIG. 9 illustrates a conventional CML M/S flip flop 9-1. The master and slave portions consist of identical circuit structures. In the master portion, the differential amplifier is clocked by device 9-2 controlled by clock CK while the cross-coupled latch is clocked by device 9-3 controlled by clock CK bar. In the slave portion, the differential amplifier is clocked by device 9-4 controlled by clock CK bar while the cross-coupled latch is clocked by device 9-5 controlled by clock CK. Thus, the clocks to the 9-4 and 9-5 devices are flipped when compared to the clocks being applied to the 9-2 and 9-3 devices.

Figure 10B:
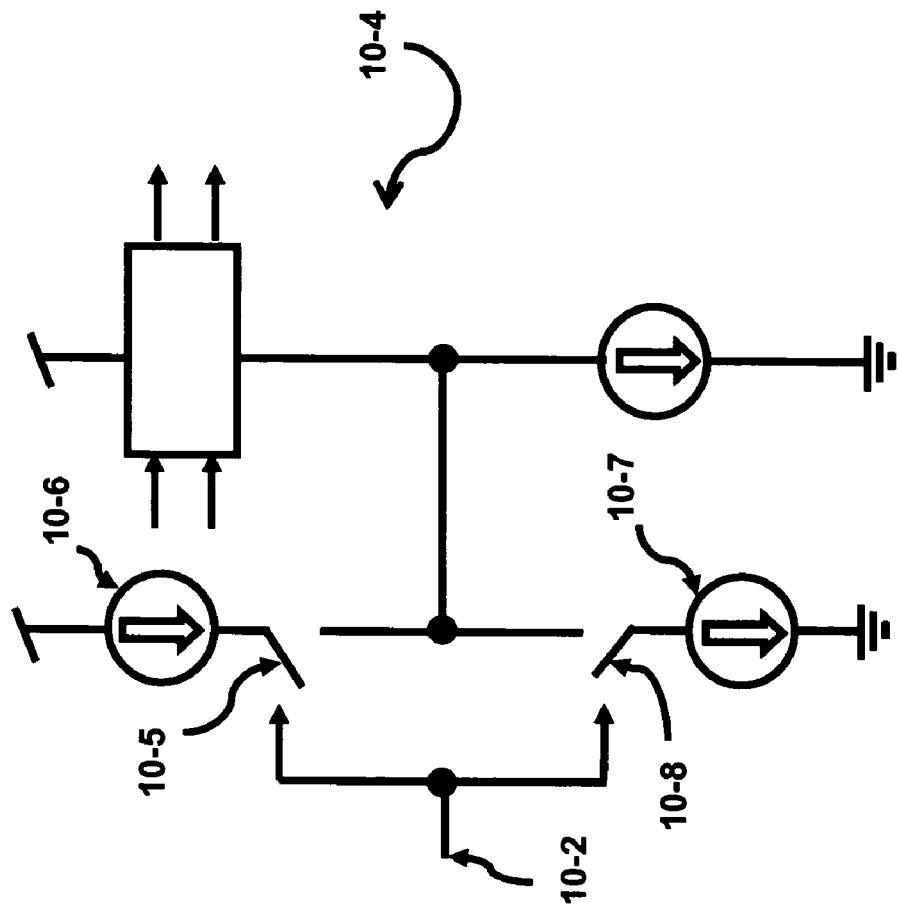
FIG. 10b depicts the replacement of the inverter in FIG. 10a with switchable current regulators in accordance with the present invention.
Figure 10A:
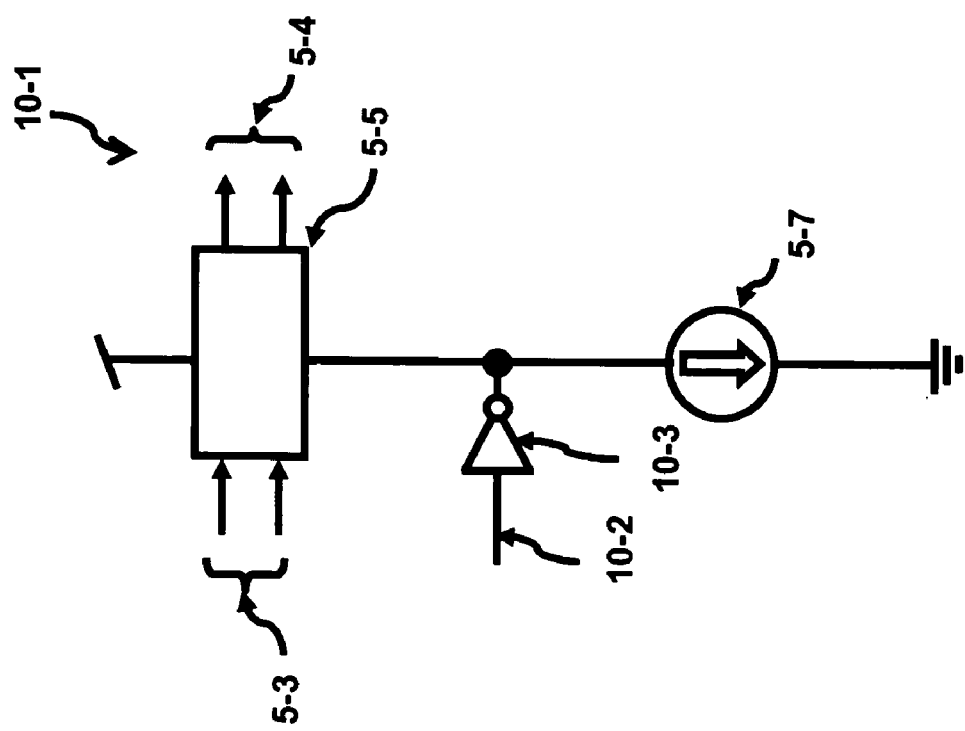
FIG. 10a illustrates the current switching circuit with the load on top in accordance with the present invention.

FIG. 10a shows the inventive current switching circuit 10-1. The stack consists of the load 5-5 and current regulator 5-7. A comparison of the FIG. 10a to FIG. 5a shows that the series device 5-6 has been removed from the stack. Thus, headroom is improved in the stack of FIG. 10a. Second, FIG. 5a uses an applied voltage and the enablement of device 5-6 to activate the stack 5-1. Thus, the gate capacitance of device 5-6 can slow down the operation of the circuit. Third, the device 5-6 can only enable or disable the stack where the current flow is controlled by the current regulator 5-7; the device 5-6 cannot easily alter the value of the current in the stack. Fourth, the inverter 10-3 in FIG. 10a introduces/extracts current directly into/from the stack 10-1. Thus, the inventive technique is a dynamically scaled current enhanced technique. Furthermore, the magnitude of the currents introduced/extracted into/from the stack can be controlled by sizing the devices in the inverter 10-3 driven by the clock signal 10-2. Thus, the inventive technique offers the ability to increase the performance of the stack and potentially could increase the frequency of operation of a circuit using the inventive current switching circuit 10-1.

FIG. 10b illustrates the stack 10-4 when the inverter 10-3 is replaced by a pair of switchable current regulators. The upper regulator 10-6 has a switch 10-5, while the lower regulator 10-7 has a corresponding switch 10-8. When the upper switch 10-5 is enabled by clock signal 10-2, the lower switch 10-8 is disabled and vice versa. Although the inverter has been replaced using only two switchable current regulators, additional components can be added to the inverter. For instance, a tri state switch can be serially coupled into either or both switchable current regulators. Also, an additional current regulator may be serially coupled to control the current flow more accurately. For instance, this added MOS gate can be controlled by the bias signal.

Figure 11B:
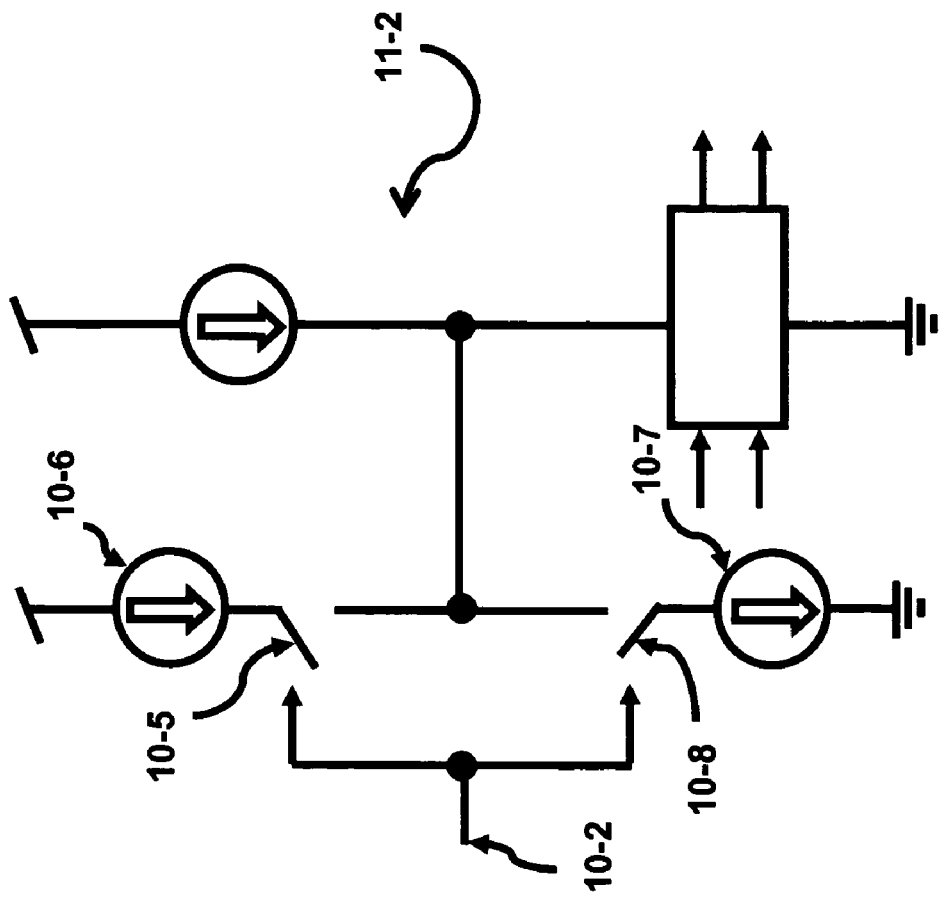
FIG. 11b depicts the replacement of the inverter in FIG. 11a with switchable current regulators in accordance with the present invention.
Figure 11A:
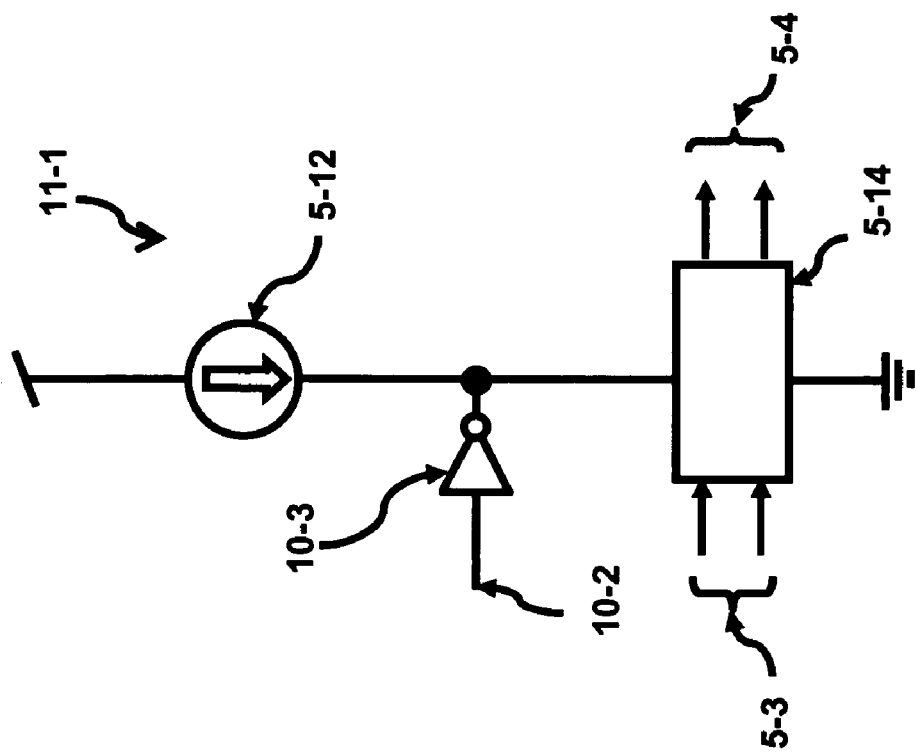
FIG. 11a illustrates the current switching circuit with the load on bottom in accordance with the present invention.

FIG. 11a shows the inventive current switching circuit 11-1. The stack consists of the load 5-14 at the bottom and current regulator 5-12. A comparison of FIG. 11a to FIG. 5c shows that the series device 5-13 has been removed from the stack. Thus, headroom is improved in the stack of FIG. 11a. Secondly, FIG. 5c uses an applied voltage and the enablement of device 5-13 to activate the stack 5-11. As mentioned before, the gate capacitance of device 5-13 can slow down the operation of the circuit. Thirdly, the device 5-13 can only enable or disable the stack where the current flow is controlled by the current regulator 5-12; the device 5-13 cannot easily alter the value of the current in the stack. Fourthly, the inverter 10-3 in FIG. 11a introduces/extracts current directly into/from the stack 11-1. Thus, the inventive technique is a dynamically scaled current enhanced technique. Furthermore, the magnitude of the currents introduced/extracted into/from the stack can be controlled by sizing the devices in the inverter 10-3 driven by the clock signal 10-2. Thus, the inventive technique offers the ability to increase the performance of the stack and potentially could increase the frequency of operation of a circuit using the inventive current switching circuit 11-1 which places the load at the bottom of the stack.

FIG. 11b illustrates the stack 11-2 when the inverter 10-3 is replaced by a pair of switchable current regulators. The upper regulator 10-6 has a switch 10-5, while the lower regulator 10-7 has a corresponding switch 10-8. When the upper switch 10-5 is enabled by clock signal 10-2, the lower switch 10-8 is disabled and vice versa.

Figure 12B:
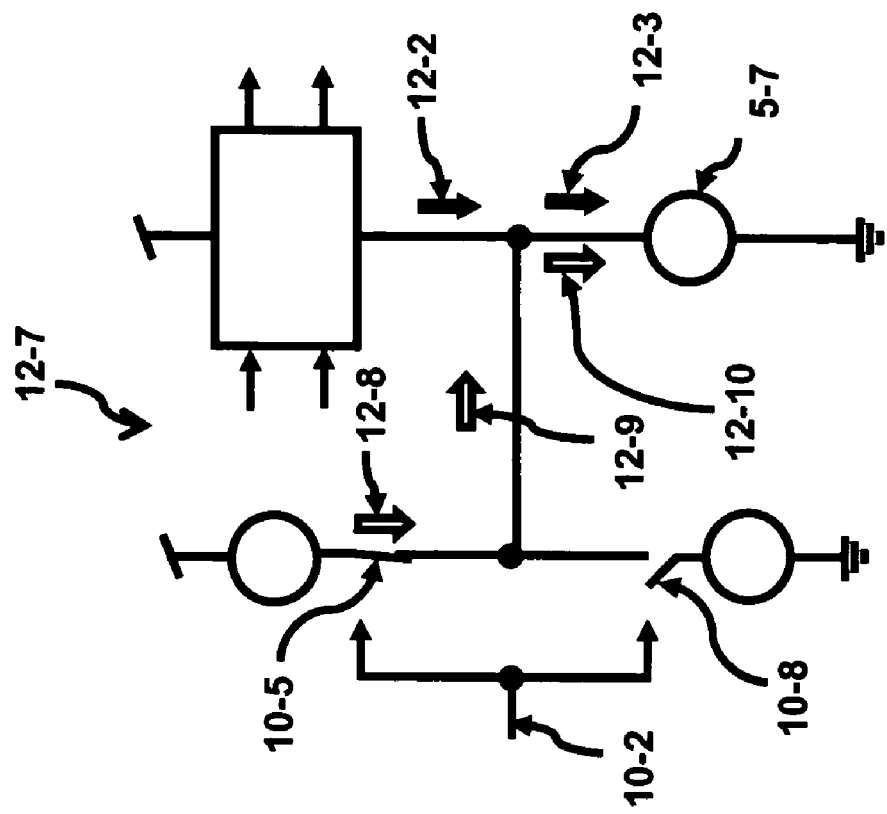
FIG. 12b depicts the current flow within the current switching circuit with the load on top and the upper switchable current regulator enabled in accordance with the present invention.
Figure 12A:
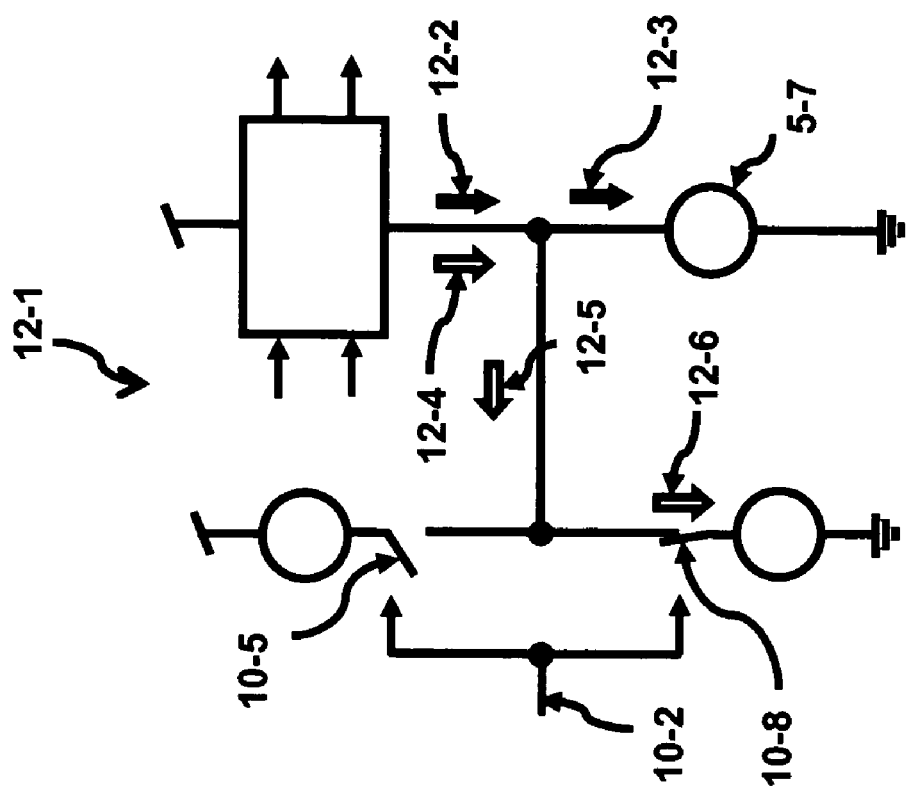
FIG. 12a illustrates the current flow within the current switching circuit with the load on top and the lower switchable current regulator enabled in accordance with the present invention.

FIG. 12a depicts the inventive current switching circuit 12-1 where the inverter sinks current 12-6 to ground. Here the state of the clock signal 10-2 is assumed to be high. The magnitude of the currents; 12-4, 12-5 and 12-6 are equivalent. Similary, the magnitude of the currents 12-2 and 12-3 are equal. Note that the current regulator 5-7 sinks current 12-3. Thus, the total current through the load is the summation of currents 12-4 and 12-2. Thus, if the load is sensing a signal, this larger current can be used to increase the sensitivity of the amplifier.

FIG. 12b depicts the inventive current switching circuit 12-7 where the inverter sources current 12-8 from the upper potential source. Here the state of the clock signal 10-2 is assumed to be low. The magnitude of the currents; 12-8, 12-9 and 12-10 are equivalent. Similarly, the magnitude of the currents 12-2 and 12-3 are equal. Note that the current regulator 5-7 sinks currents 12-3 and 12-10. However, the current regulator 5-7 will limit the current flow in this branch. Since there are two currents; 12-10 and 12-3, the summation of the two will be equal to the current regulated by 5-7. For instance the current 12-10 can be designed to be greater than the current 12-3. Thus, this inventive technique offers the ability to control the total current through the load in both states of the applied clock signal 10-2. The conventional circuit indicated in FIG. 5a lacked the ability to control or adjust the current flow through the load in both states of the clock. Thus, if the load is sensing a signal, a larger current can be used to increase the sensitivity of the amplifier and increase its performance. Once the signal is captured, the current through the load can be reduced.

Figure 13:
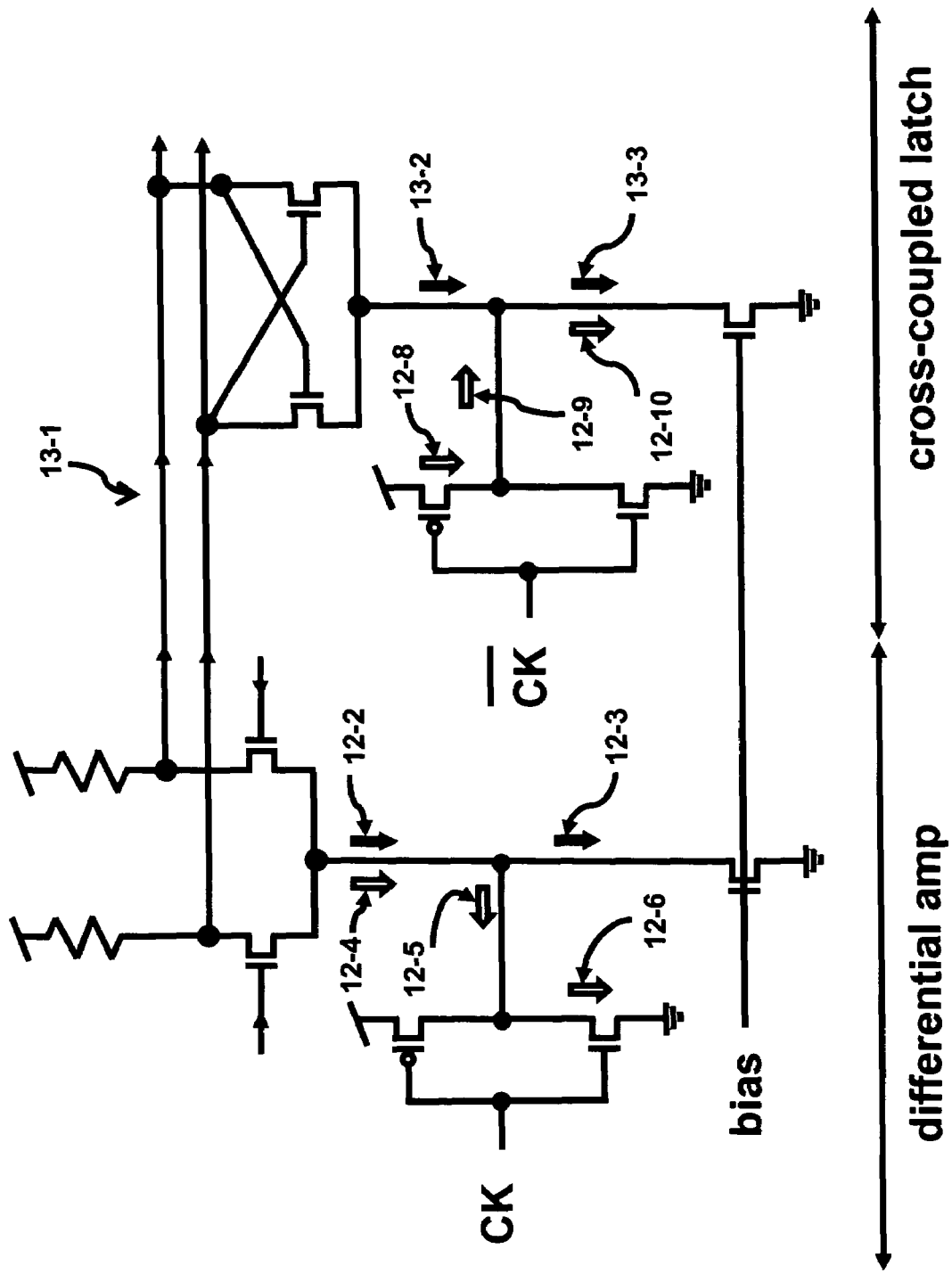
FIG. 13 shows a current switching latching apparatus where the differential amplifier is in a sensing state while the cross-coupled latch is in a relaxed state in accordance with the present invention.

FIG. 13 illustrates the new inventive technique applied to a current switching latching apparatus 13-1 to capture a signal. A differential amplifier is coupled to a cross-coupled latch. The current flow through the amplifier is the summation of currents 12-4 and 12-2. Thus, the amplifier is made more sensitive and offers an increase in performance. Meanwhile, the current 13-2 through the latch has been reduced by the introduction of the current 12-10 from the clocked inverter. Thus, the latch can be easily overwritten and provides for an improvement in performance since the current through the latch has been reduced. In addition, the balanced differential CK and CK bar signals that are applied to the current switching latching apparatus 13-1 are generated by the VCO. The VCO is a balanced circuit creating both CK and CK not simultaneously.

Figure 14A:
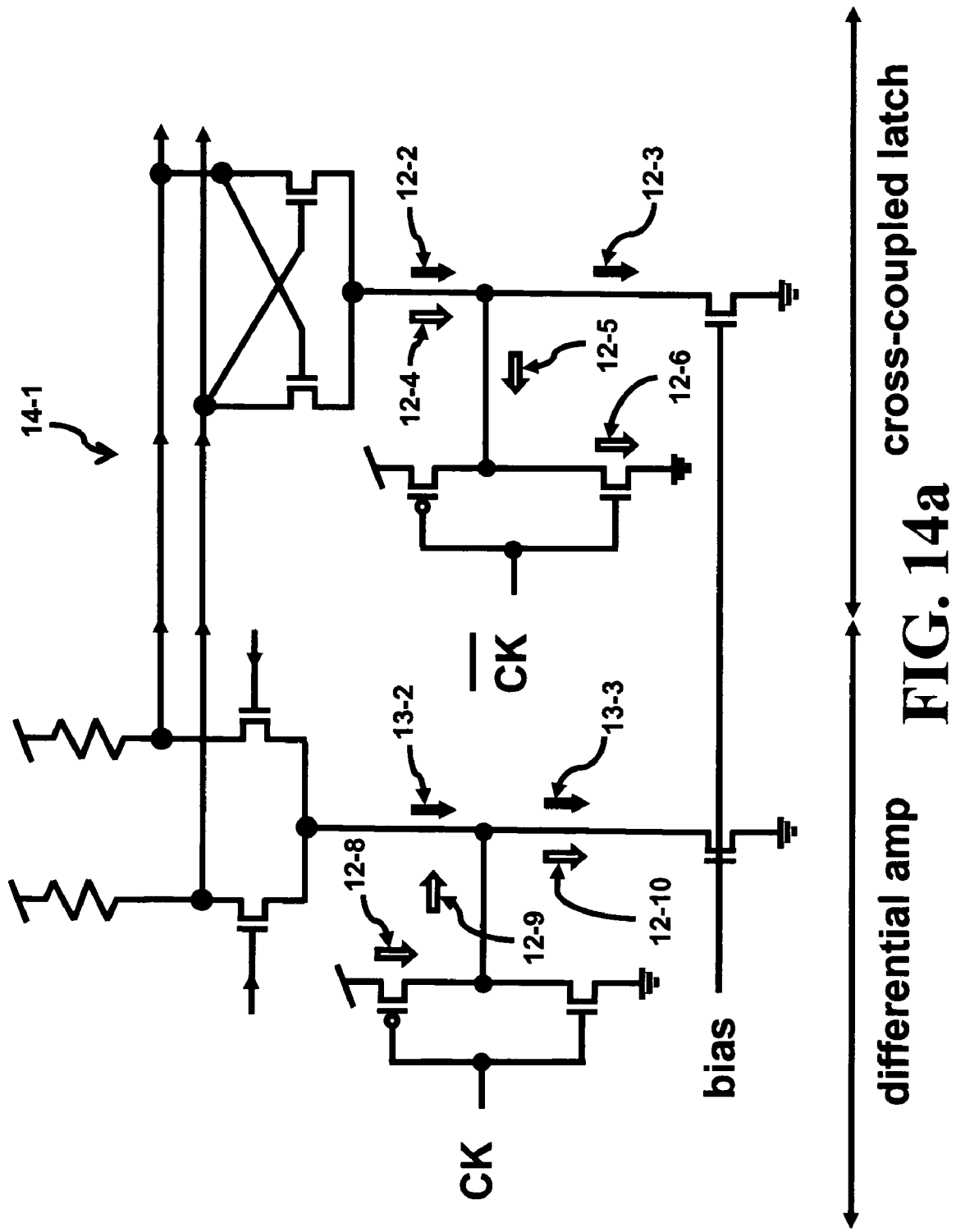
FIG. 14a illustrates a current switching latching apparatus where the differential amplifier is in a relaxed state while the cross-coupled latch is in a holding state in accordance with the present invention.

FIG. 14a illustrates the same circuit as shown in FIG. 13 except the value of the clock signals have been inverted. In this condition, the current switching latching apparatus 14-1 holds or captures a signal. The current flow through the amplifier is the summation of currents 13-2. Thus, the amplifier is made less sensitive. Meanwhile, the current 12-4 and 12-2 through the latch has been increased by the introduction of the current 12-6 from the second clocked inverter. Thus, the cross-coupled latch latches and holds the applied data and provides for an improvement in performance since the current through the latch has been increased.

Figure 14B:
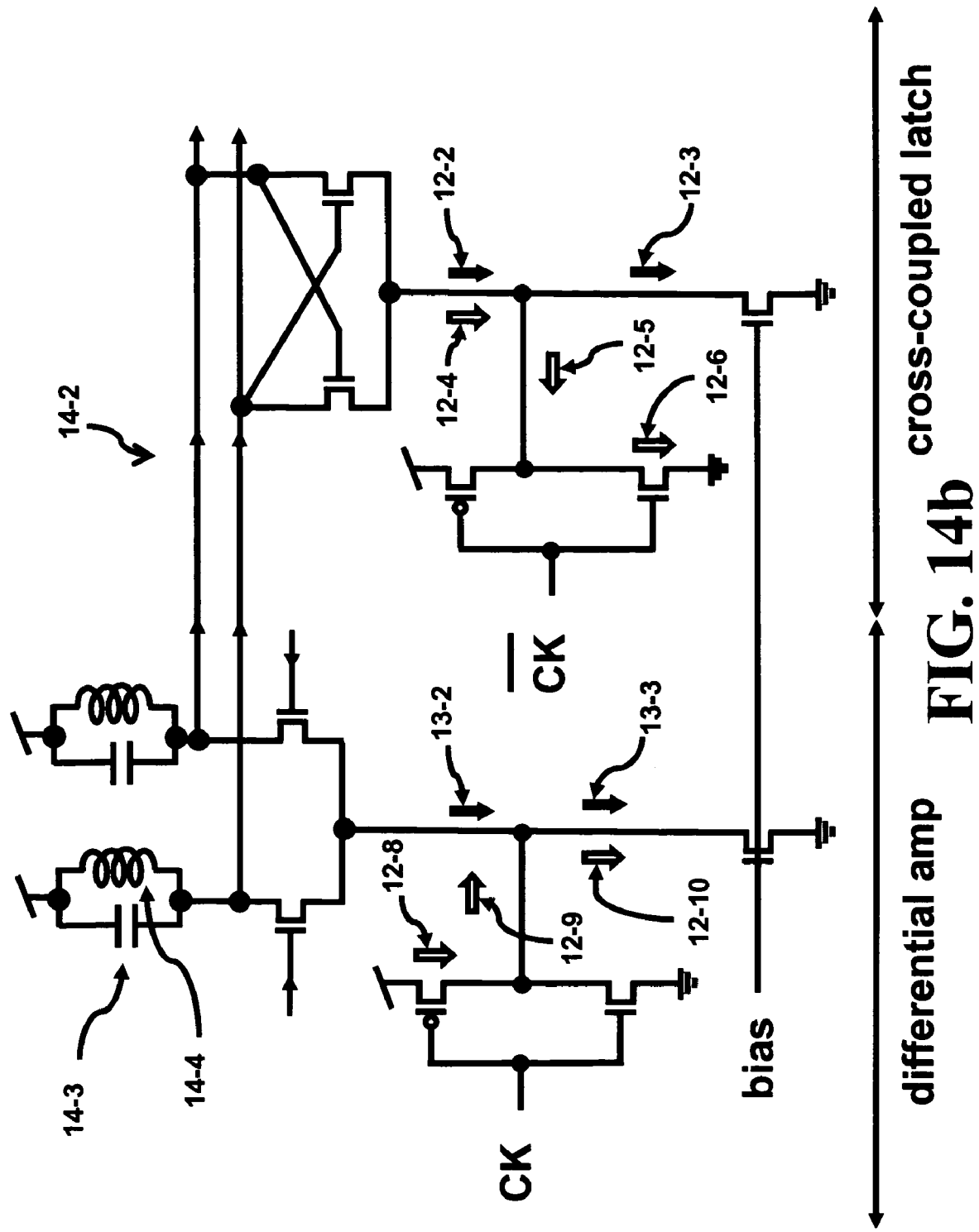
FIG. 14b depicts the resistive load of the differential amplifier replaced with resonant LC tank circuits in accordance with the present invention.

FIG. 14b depicts a similar circuit 14-2 as shown in FIG. 14a except that the internal resistive load of the circuit has been replaced by the resonant circuit consisting of the capacitor 14-3 and the inductor 14-4. This resonant circuit load is illustrates as a parallel tank circuit but it can be a series tank as well. In addition, the inductor may be lossy. Otherwise all the remaining labeled elements share the same description as those of FIG. 14a.

Figure 15A:
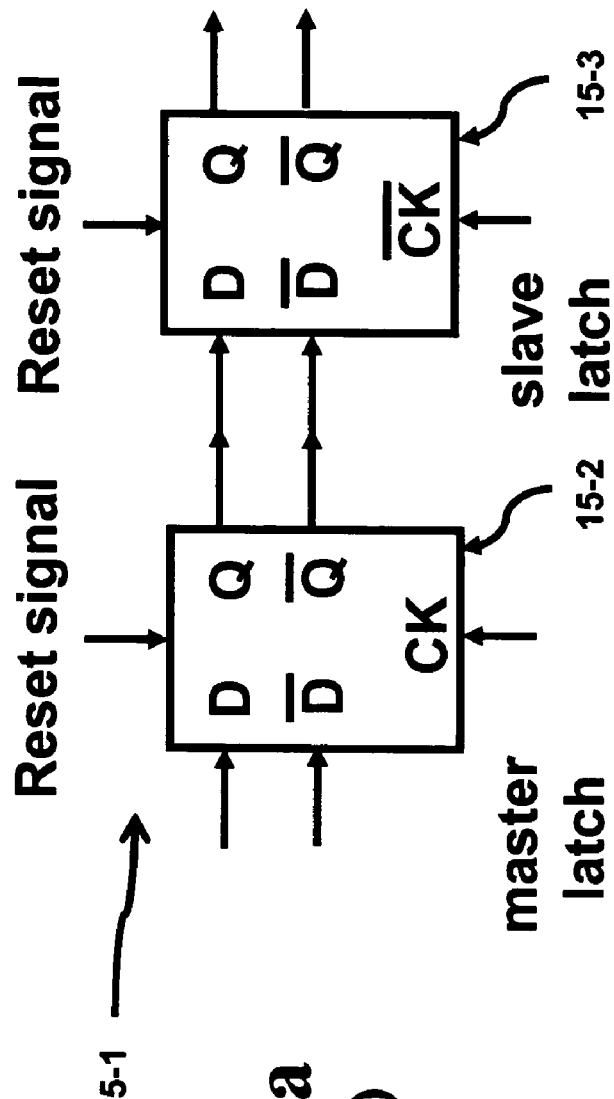
FIG. 15a illustrates a block diagram of a master and slave latch with a reset signal.
Figure 15B:
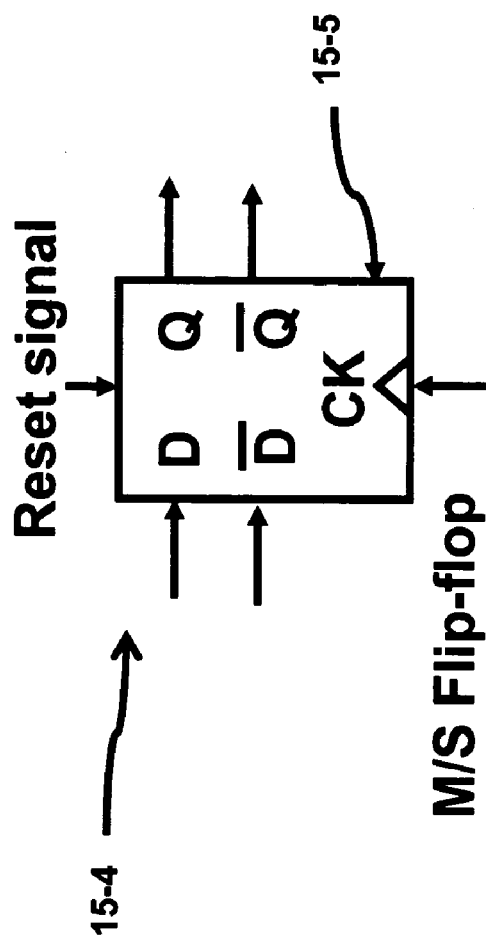
FIG. 15b illustrates the symbol for a M/S flip flop with a reset signal.
Figure 16:
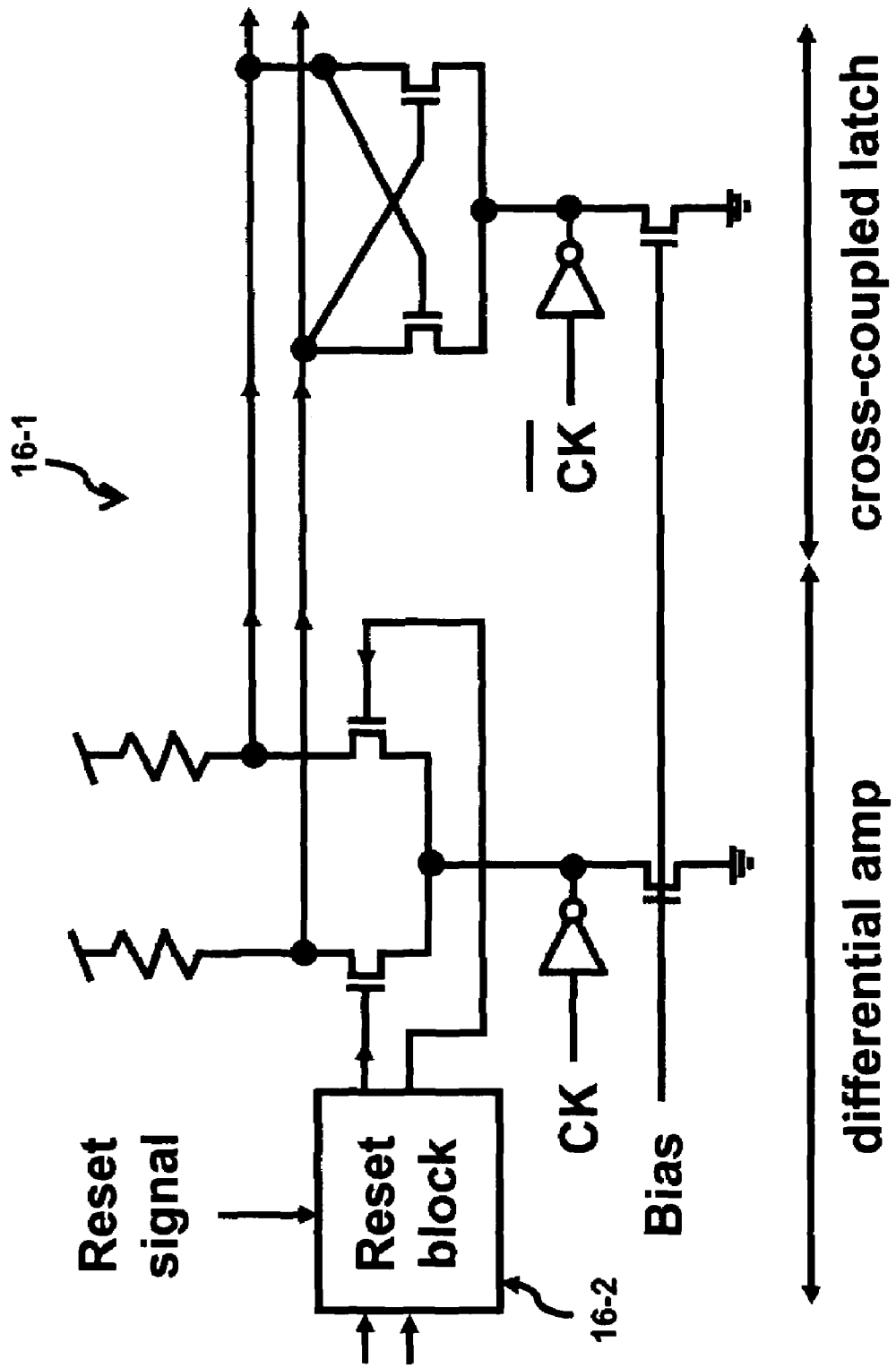
FIG. 16 depicts the reset block inserted into the current switching circuit in accordance with the present invention.

FIG. 15a depicts a block diagram 15-1 of a master latch 15-2 coupled to a slave latch 15-3. Both latches have a reset signal. The M/S flip flop 15-4 in FIG. 15b is illustrated by the symbol 15-5. This is a resetable FF. A circuit diagram 16-1 of the inventive current switching latching apparatus with a reset block 16-2 is provided in FIG. 16. The reset signal can initialize the latch to a know state. This is one of several ways the circuit can be initialized as known in the art.

Figure 17:
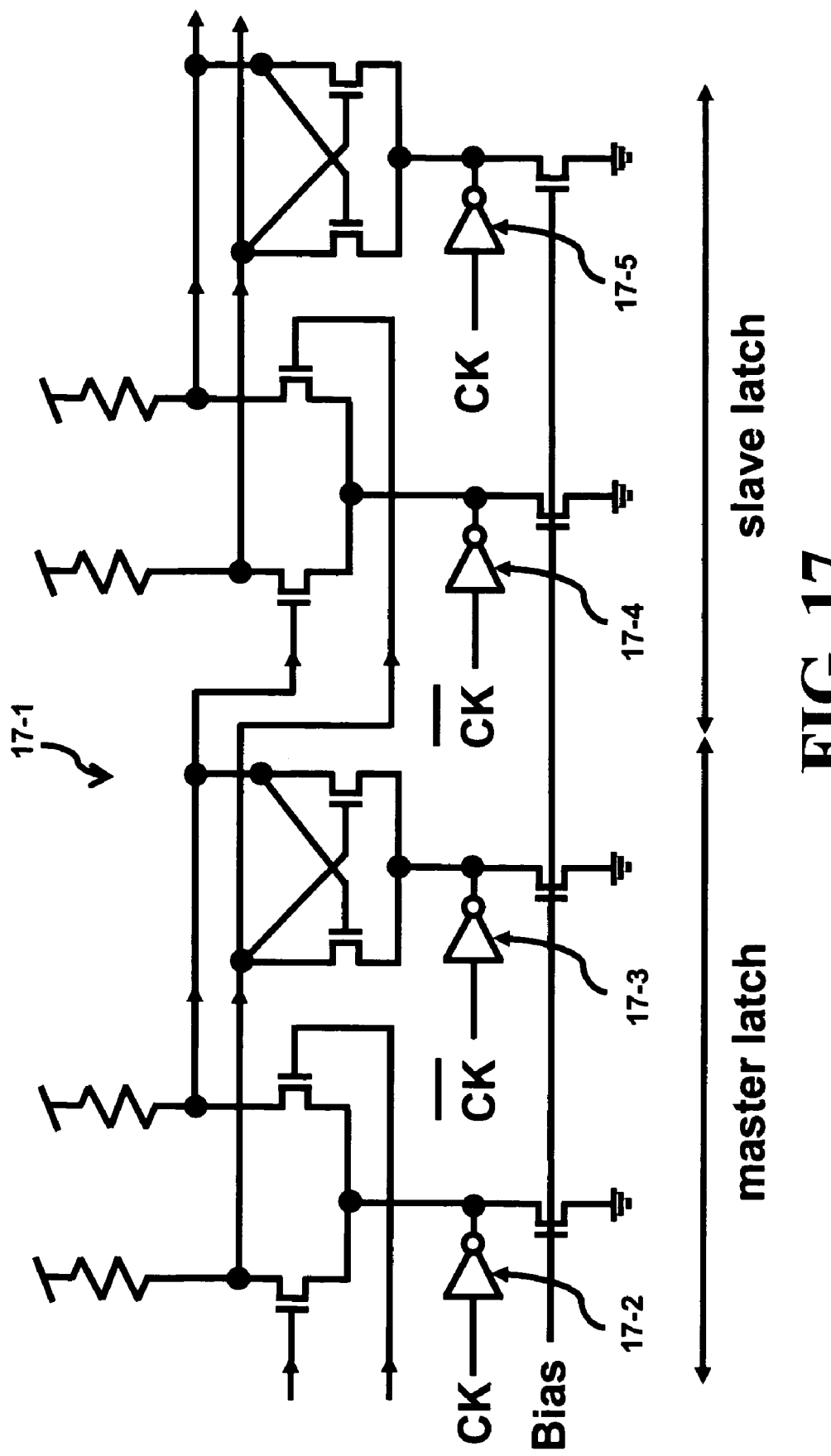
FIG. 17 shows two current switching latching apparatuses configured as a master/slave flip flop in accordance with the present invention.

FIG. 17 shows the inventive technique applied to two current switching latching apparatuses configured as a Master/Slave flip flop 17-1. Note that the first apparatus is clocked by inverters 17-2 and 17-3. Their inputs are clocked by CK and CK bar, respectively. The second apparatus is clocked by inverters 17-4 and 17-5. Their inputs are clocked by CK bar and CK, respectively. A group of small matched inverters can be used to drive each current switching circuit independently within the entire prescaler formed using these M/S flip flops as compared to a single large buffer or inverter driving the entire conventional prescaler.

Figure 18:
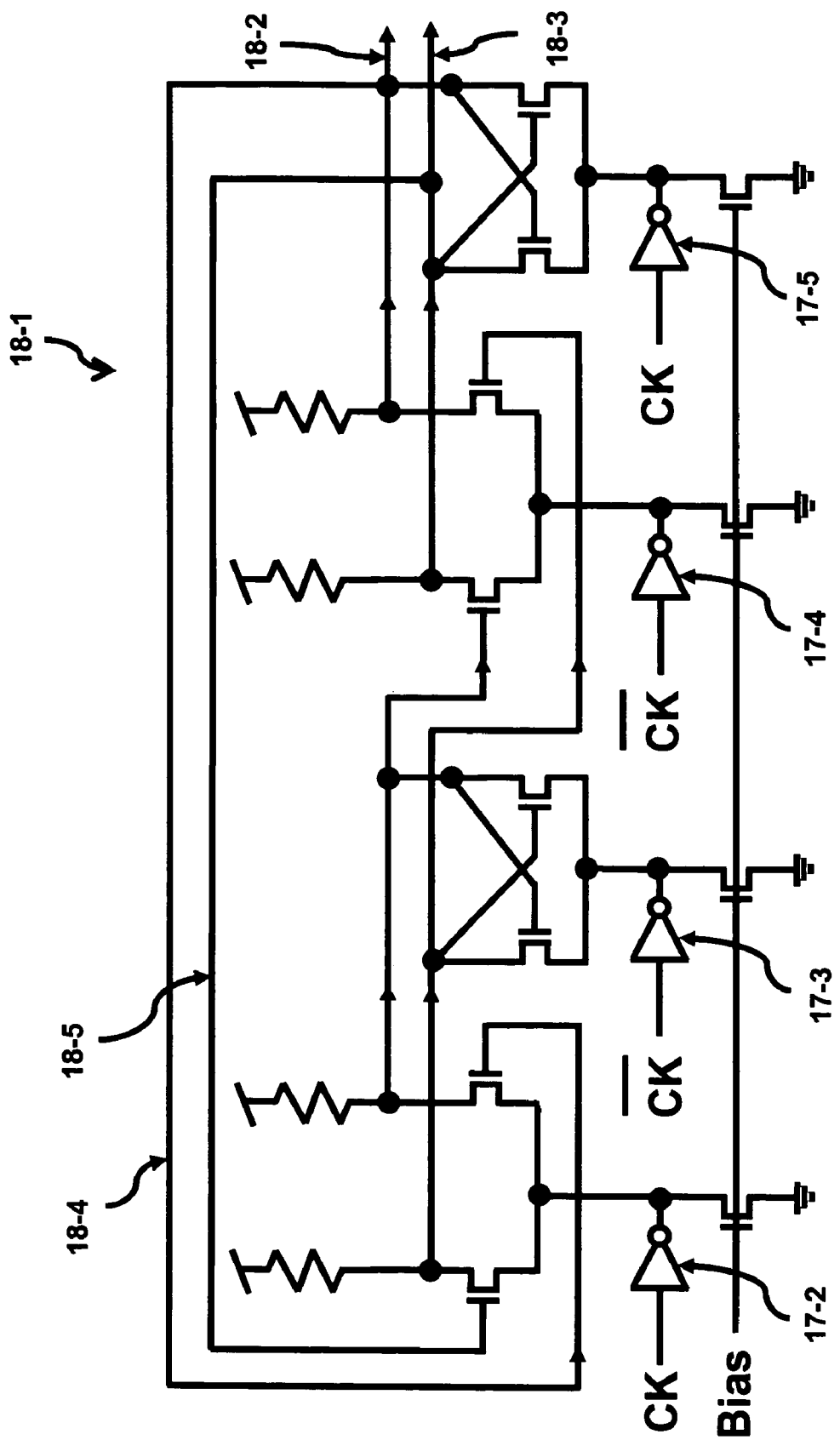
FIG. 18 shows two current switching latching apparatuses configured as a frequency divider apparatus in accordance with the present invention.

Finally, a frequency divider apparatus 18-1 (divide by two) is illustrated in FIG. 18. The master is coupled to the slave latch forming a M/S flip flop and the outputs of the apparatus 18-2 and 18-3 are feedback to the inputs of the master latch. The feedback paths are indicated as 18-4 and 18-5. The total numbers of inversions in each of these paths is odd to insure that a divide by operation occurs.

Several additional conditions are stated to better understand the invention; however, this is not an exhaustive list but one to merely provide a better perspective in various addition design possibilities. For example, certain of the signal lines in the various FIG's are shown as single ended signal lines. In reality, many of the signals are differential, meaning that there are in fact at least two signal lines. A current switching circuit contains a load that can include a CML amplifier or CML cross-coupled latch. Furthermore the resistive load of the amplifier can be replaced with a resonant LC circuit. Note that both the high-speed latching technique and its application to frequency dividers utilize the current switching circuit technique.

The input signal and output signal of the cross-coupled latch also share the same leads. In one case, an external stimulus is applied to the leads causing the latch to overwrite its contents and stores the stimulus within the latch. In a second case, the cross-coupled latch provides the values of the stimulus which was stored in the cross-coupled latch as an output signal.

In addition, the potential sources are power supply sources such as VDD, VSS or any other supply that provides a source and sink to current and provide power to the circuit. The cross-coupled latch and differential amplifier may also contain a reset signal to initialize the value in a latch to a know state. These CML circuits can generate a small voltage swing or be adjusted to achieve the desired performance by varying the current within the circuit. Also, certain prescalers can bypass a portion of said current switching latching apparatuses coupled in series. This implies that this portion of the loop is effectively removed from the circuit.

The inverter can consist of a conventional inverter, a tri-statable inverter, or a current controlled inverter. The switchable current regulator can be formed using as little as one MOS device where the switch is provided by enabling the gate of the MOS device. Or the switchable current regulator can contain a tri state device to disable the inverter. Finally, the switchable current regulator may consist of a current regulated device coupled in series with the conventional inverter. That is, it may contain more than one switchable current source in each leg controlled by an additional enablement signal or bias signal. In addition, a current regulator can imply a current sink, a current load, a switchable current sink and a switchable current source without any loss in the basic principles of the invention. The components of the current switching circuit can be mirrored to the bias regulated current regulator. The regulators in the inverters can be scaled in size to be one, less than one or greater than one when compared to the current sink/source in the current stack. The present technique also offers advantages in terms of performance and power reduction. Still other variations will be apparent to a person of skill in the art.

Finally, the differential amplifier has separate inputs and outputs while the cross-coupled latch combines the inputs and outputs into common lines. The differential amplifier and cross-coupled latch are well known in the art. Most of the nodes shown in the FIG's do not show capacitors (for simplicity), it is understood that those skilled in the art will appreciate this simplicity to help provide a better understanding of the invention.

The invention claimed is:

1. A current switching circuit comprising;
a load coupled to a first and a second node;
a current regulator coupled to said second and a third node;
an output of an inverter coupled to said second node; and
a clock signal coupled to an input of said inverter.

2. The circuit of claim 1 further comprising;
a first source of potential coupled to said first node; and
a second source of potential coupled to said third node.

3. The circuit of claim 1, wherein
a first logic level of said clock signal forces said load into a first operating state; and
a second logic level of said clock signal forces said load into a second operating state.

4. The circuit of claim 1 further comprising;
a reset signal to initialize a value held in said load to a known state.

5. The circuit of claim 1, wherein
said load is comprised of a circuit selected from the group consisting of a differential amplifier and a cross-coupled latch.

6. The circuit of claim 5, wherein
an internal load of said load is comprised of a circuit selected from the group consisting of a resistor and an LC resonant circuit.

7. The circuit of claim 1, wherein
said clock signal adjusts an operating characteristic of said load.

8. The circuit of claim 7, wherein
said operating characteristic is comprised of a parameter selected from the group consisting of a power dissipation reduction, performance enhancement and noise reduction.

9. The circuit of claim 1, wherein
said inverter comprises;
a first switchable current regulators coupled between said first and second nodes; and
a second switchable current regulator coupled between said second and third nodes; wherein
said clock signal enables either said first or said second switchable current regulators.

10. The circuit of claim 9, wherein
said current switching circuit is comprised of devices selected from the group consisting of MOS transistors, CMOS transistors and BJT transistors.

11. The circuit of claim 10, wherein
said device of said current regulator is a scaled version of said device of said second switchable current regulator.

12. The circuit of claim 10, wherein
said device of said first switchable current regulator is a scaled version of said device of said second switchable current regulator.

13. A current switching latching apparatus comprising;
at least two current switching circuits; wherein
a current switching circuit comprises;
a load coupled to a first and a second node;
a current regulator coupled to said second and a third node;
an output of an inverter coupled to said second node;
a clock signal coupled to an input of said inverter; and a load of a first current switching circuit comprises;
a differential amplifier;
at least one input signal;
at least one output signal; and
a load of a second current switching circuit comprises;
a cross-coupled latch; and
at least one output signal; whereby
said output signal of said differential amplifier is coupled to said output signal of said cross-coupled latch.

14. The apparatus of claim 13, wherein
said clock signal of said second current switching circuit is essentially 180° out of phase with said clock signal of said first current switching circuit;
a first logic level of said clock signal of said first current switching circuit forces said differential amplifier into a sensing state; and
a second logic level of said clock signal of said first current switching circuit forces said cross-coupled latch into a holding state.

15. The apparatus of claim 14, wherein
said sensing state amplifies a value of said input signal coupled to said differential amplifier; and
said holding state latches said value of said output signal in said cross-coupled latch.

16. The apparatus of claim 13, wherein
said plurality of current switching circuits are comprised of devices selected from the group consisting of MOS transistors, CMOS transistors and BJT transistors.

17. The apparatus of claim 13 further comprising;
a first source of potential coupled to said first node of said current switching circuits; and
a second source of potential coupled to said third node of said current switching circuits.

18. The apparatus of claim 13 further comprising;
a reset signal to initialize a value held in said load of said first and said second current switching circuit to a known state.

19. A frequency divider apparatus comprising;
an input terminal and an output terminal;
a current switching circuit comprising;
a load coupled to a first and a second node;
a current regulator coupled to said second and a third node;
an output of an inverter coupled to said second node;
a clock signal coupled to an input of said inverter;
said load having an input port and an output port; and
a current switching latching apparatus comprising;
at least two current switching circuits; wherein
said load of said first current switching circuit comprises a differential amplifier;
said load of said second current switching circuit comprises a cross-coupled latch;
said output port of said differential amplifier is coupled to said input port of said cross-coupled latch;
said input port of said differential amplifier is coupled to said input terminal;
said output port of said cross-coupled latch is coupled to said output terminal; and
a plurality of current switching latching apparatuses coupled in series forming a closed loop;
wherein
said output terminal of said last current switching latching apparatus is coupled to said input terminal of said first current switching latching apparatus.

20. The apparatus of claim 19, wherein
said clock signal of said first current switching latching apparatus is out of phase with said clock signal of said second current switching latching apparatus; wherein
a first logic level of said first clock signal forces said first current switching latching apparatus into a capturing state; and
a second logic level of said first clock signal forces said second current switching latching apparatus into a holding state.

21. The apparatus of claim 20, wherein
said out of phase is essentially 180° out of phase.

22. The apparatus of claim 19, wherein
a frequency generated within said closed loop is lower than an applied frequency of said clock signal.

23. The apparatus of claim 19, wherein
said closed loop contains an odd number of inversions.

24. The apparatus of claim 19 further comprising;
a plurality of output signals; wherein
said output signals are coupled to a plurality of nodes forming said closed loop.

25. The apparatus of claim 19 further comprising;
a first source of potential coupled to said first node of said current switching circuits; and
a second source of potential coupled to said third node of said current switching circuits.

26. The apparatus of claim 19 further comprising;
a channel select control; wherein
a first state of said channel select control bypasses a portion of said current switching latching apparatuses coupled in series forming a second closed loop; and
a second state of said channel select control encompasses all of said current switching latching apparatuses coupled in series forming said closed loop.

27. The apparatus of claim 26 further comprising;
a plurality of output signals;
said first state of said channel select control generates a frequency output at said output signals; and
said second state of said channel select control decreases said frequency output at said output signals.

28. A method of adjusting a total current in a load dynamically, the method comprising the steps of;
regulating a first current through a load using a current regulator;
coupling the output of an inverter at a junction between said load and said current regulator;
applying a clock signal to an input of said inverter to introduce an additional current through said load; and
summing said first current and said additional current to form said total current; thereby
adjusting said total current in said load dynamically.

29. The method of claim 28, further comprising the steps of providing a plurality of potential sources to maintain a flow of said total current.

30. The method of claim 28 wherein;
adjusting said total current adjusts an operating characteristic of said load.

31. A current switching circuit comprising;
a means for regulating a current in a load using a current regulator;
a means for introducing an additional current through said load;
a clock signal adjusts said additional current means; thereby
adjusting an overall current in said load dynamically.

* * * * *